(12) United States Patent
Whang et al.

(10) Patent No.: US 11,890,846 B2
(45) Date of Patent: Feb. 6, 2024

(54) METHOD OF TRANSFERRING GRAPHENE AND FLEXIBLE TRANSPARENT ELECTRODE USING THE SAME

(71) Applicant: Research & Business Foundation Sungkyunkwan University, Suwon-si (KR)

(72) Inventors: Dongmok Whang, Suwon-si (KR); YoungMin Seo, Suwon-si (KR); Wonseok Jang, Suwon-si (KR); Tae Jun Gu, Seongnam-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 144 days.

(21) Appl. No.: 17/186,405

(22) Filed: Feb. 26, 2021

(65) Prior Publication Data
US 2021/0276317 A1 Sep. 9, 2021

(30) Foreign Application Priority Data
Mar. 3, 2020 (KR) .................. 10-2020-0026590

(51) Int. Cl.
| | |
|---|---|
| B32B 37/00 | (2006.01) |
| C23C 16/26 | (2006.01) |
| C01B 32/184 | (2017.01) |
| B32B 43/00 | (2006.01) |
| B32B 9/00 | (2006.01) |
| B32B 27/28 | (2006.01) |
| B32B 27/26 | (2006.01) |

(52) U.S. Cl.
CPC ............. *B32B 37/025* (2013.01); *B32B 9/007* (2013.01); *B32B 27/26* (2013.01); *B32B 27/28* (2013.01); *B32B 43/006* (2013.01); *C01B 32/184* (2017.08); *C23C 16/26* (2013.01); *B32B 2305/72* (2013.01); *B32B 2457/00* (2013.01)

(58) Field of Classification Search
CPC ..... B32B 9/007; C01B 32/184; Y10T 428/30; B82Y 30/00
USPC .................................. 428/408; 423/447.1
See application file for complete search history.

(56) References Cited

U.S. PATENT DOCUMENTS

| | | | |
|---|---|---|---|
| 2015/0151528 A1* | 6/2015 | Shimizu ................. | B32B 38/10 428/408 |
| 2018/0033864 A1* | 2/2018 | Cao ........................ | H01L 27/20 |

FOREIGN PATENT DOCUMENTS

KR    10-2013-0132105 A    12/2013

\* cited by examiner

*Primary Examiner* — Daniel H Miller
(74) *Attorney, Agent, or Firm* — NSIP Law

(57) ABSTRACT

The present disclosure relates to a method of transferring a graphene, the method comprising the steps of: forming a graphene on a first substrate; forming a polymer precursor mixture on a second substrate; disposing the graphene oppositely to the second substrate having the polymer precursor mixture formed thereon; pressing the first substrate and the second substrate while curing the polymer precursor mixture; and peeling off the first substrate.

14 Claims, 27 Drawing Sheets
(9 of 27 Drawing Sheet(s) Filed in Color)

30

40

FIG. 9
(a) 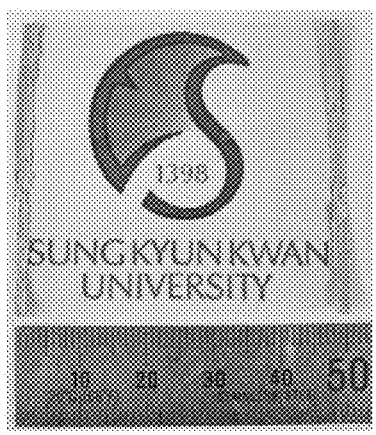 (b) 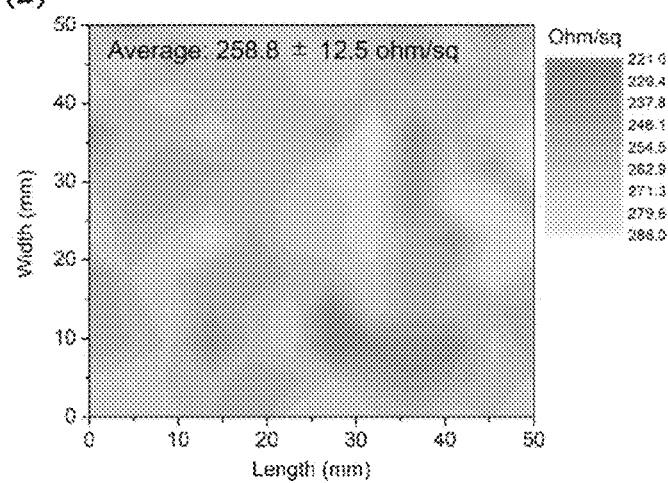

FIG. 13
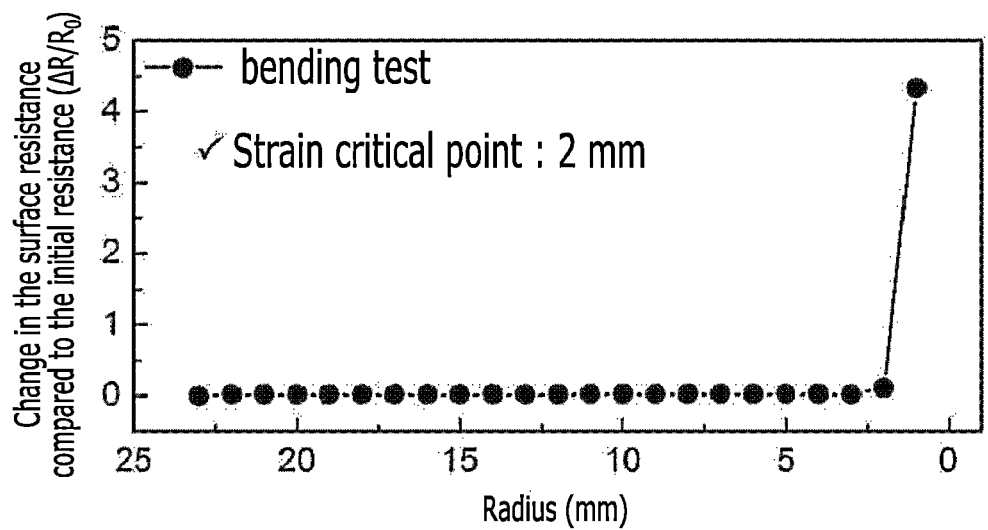
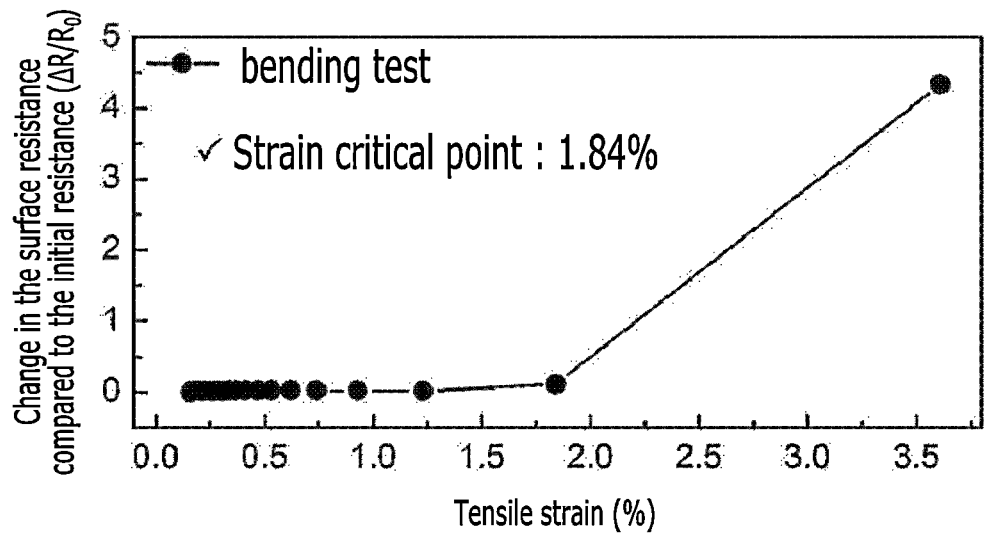

METHOD OF TRANSFERRING GRAPHENE AND FLEXIBLE TRANSPARENT ELECTRODE USING THE SAME

CROSS-REFERENCE TO RELATED APPLICATIONS

This application claims the priority of Korean Patent Application No. 10-2020-0026590 filed on Mar. 3, 2020, in the Korean Intellectual Property Office, the disclosure of which is incorporated herein by reference.

BACKGROUND

Field

The present disclosure relates to a method of transferring a graphene, and a flexible transparent electrode using the same.

Description of the Related Art

Graphene as a two-dimensional carbon material is an atomically thin film structure consisting of a single carbon atom layer forming a hexagonal honeycomb-shaped structure. As it has advantages of having excellent electron mobility, strength, thermal conductivity, and having transparency, graphene is in the spotlight as a material that can be utilized in various ways such as displays, secondary batteries, solar cells, light emitting elements, catalysts, and sensors.

A metal catalyst is required to acquire graphene with high-crystallinity and a large area. In order to use a graphene synthesized using the metal catalyst in elements, a transfer process of separating the metal catalyst and moving the separated metal catalyst to a separate substrate is required.

A method of transferring a graphene is divided into a wet-type transfer method and a dry-type transfer method. A general wet-type transfer method comprises coating a polymer such as PDMS, PMMA, or the like, etching a metal catalyst using the polymer as a support layer, and then moving graphene to a desired substrate. As polymer residues are remained on graphene, and solution treatment for etching and polymer removal is required in such a wet-type transfer method, there are problems that defects and quality deterioration of graphene occur in the wet-type transfer method accordingly.

Furthermore, a general dry-type transfer method comprises adhering a thermal peelable tape to the surface of graphene, transferring graphene, and then applying heat to peel off the tape. The dry-type transfer method also has a problem that defects occur as a portion of graphene may be peeled off together; or residues of the tape are remained on the surface of graphene in the tape peeling process.

Korean Patent No. 10-1969853 that is a background art of the present disclosure relates to a method of transferring a graphene, and a method of manufacturing elements using the same. Although the foregoing patent discloses a method of transferring a graphene using a polymer protection layer, a problem that residues are remained on graphene has not been solved since the polymer protection layer is used.

Accordingly, research on transfer methods capable of preventing defects and quality deterioration of graphene is required.

SUMMARY

The present disclosure, which is for solving the foregoing problems of the related art, provides a method of transferring a graphene, and a flexible transparent electrode using the same.

However, technical tasks intended to be achieved by examples of the present disclosure are not limited to the technical tasks as mentioned above, and the other technical tasks may exist.

As a technical means for achieving the above-mentioned technical tasks, a first aspect of the present disclosure provides a method of transferring a graphene, the method comprising the steps of: forming a graphene on a first substrate; forming a polymer precursor mixture on a second substrate; disposing the graphene oppositely to the second substrate having the polymer precursor mixture formed thereon; pressing the first substrate and the second substrate while curing the polymer precursor mixture; and peeling off the first substrate.

According to an embodiment of the present disclosure, although the polymer precursor mixture may contain a dopant material and a curing agent, the polymer precursor mixture is not limited thereto.

According to an embodiment of the present disclosure, although the dopant material is cross-linked by the curing agent so that a network-structured polymer may be formed, the dopant material is not limited thereto.

According to an embodiment of the present disclosure, although the dopant material may comprise an amine group-containing polymer or a precursor thereof, the dopant material is not limited thereto.

According to an embodiment of the present disclosure, although the polymer precursor mixture may comprise the dopant material and the curing agent at a ratio of 10:1 to 1,000:1, the polymer precursor mixture is not limited thereto.

According to an embodiment of the present disclosure, although the curing agent may be selected from the group consisting of glutaraldehyde, propylene dialdehyde, butyl dialdehyde, pentane-2,4-dione, acetylacetone, acetonylacetone, and combinations thereof, the curing agent is not limited thereto.

According to an embodiment of the present disclosure, although the curing process may be carried out under a temperature of 100° C. to 200° C., the curing process is not limited thereto.

According to an embodiment of the present disclosure, although the step of forming the polymer precursor mixture may be carried out by a method selected from the group consisting of a spin coating method, a cast method, Langmuir-Blodgett method, an inkjet printing method, a nozzle printing method, a slot die coating method, a doctor blade coating method, a screen printing method, a dip coating method, a gravure printing method, a reverse offset printing method, a physical transfer method, a spray coating method, a chemical vapor deposition method, a thermal deposition method, a vacuum deposition method, and combinations thereof, the step of forming the polymer precursor mixture is not limited thereto.

According to an embodiment of the present disclosure, although the step of forming a graphene on the first substrate may be carried out by forming a metal catalyst on the first substrate, and performing a heat treatment process while injecting a gas-phase carbon supply source, the step of forming a graphene on the first substrate is not limited thereto.

According to an embodiment of the present disclosure, although the first substrate may include a substrate selected from the group consisting of glass, plastics, silicon, saphire, nitride, and combinations thereof, the first substrate is not limited thereto.

According to an embodiment of the present disclosure, although the catalyst may be selected from the group consisting of Cu, Ni, Sc, Ti, V, Cr, Mn, Fe, Co, Zn, Al, Ti, Si, Mg, Y, Zr, Nb, Mo, Tc, Ru, Rh, Pd, Ag, Cd, Hf, Ta, W, Re, Os, Ir, Pt, Au, Hg, Rf, and combinations thereof, the catalyst is not limited thereto.

According to an embodiment of the present disclosure, although the gas-phase carbon supply source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof, the gas-phase carbon supply source is not limited thereto.

According to an embodiment of the present disclosure, although the second substrate may be selected from the group consisting of polyethylene naphthalate, silicone, polyimide, polycarbonate, polynorbornene, polyacrylate, polyvinyl alcohol, polyethylene terephthalate, polyethersulfone, polystyrene, polypropylene, polyethylene, polyvinyl chloride, polyamide, polybutylene terephthalate, polymethacrylate, polydimethylsiloxane, and combinations thereof, the second substrate is not limited thereto.

According to an embodiment of the present disclosure, although the graphene may be n-type doped while the polymer precursor mixture is being cured, the graphene is not limited thereto.

A second aspect of the present disclosure provides a flexible transparent electrode comprising a graphene transferred by a method according to the first aspect of the present disclosure.

The above-mentioned task solving means are merely for the illustrative purpose, and shah not be construed as intended to limit the present disclosure. In addition to the illustrative examples described above, additional examples may exist in drawings and detailed descriptions of the present disclosure.

Problems of an existing wet-type transfer method can be solved since the foregoing task solving means of the present disclosure enables delamination of graphene from a catalyst without damaging graphene using a polymer precursor mixture although a graphene transfer method according to the present disclosure is a dry-type transfer method.

Specifically, the process of peeling off the catalyst is performed by a mechanical force. As the above-mentioned polymer precursor mixture in a transfer method according to the present disclosure forms a strong bond with graphene by a curing process, the polymer precursor mixture is not broken up even when peeling off the first substrate and the second substrate by applying a mechanical force to a first substrate and a second substrate. Accordingly, the graphene and the first substrate on which the catalyst is formed are effectively separated. The first substrate can be reused since this effective separation does not damage the first substrate as well as the graphene.

A graphene transfer method according to the present disclosure enables dry-type transfer of graphene on a rigid substrate or a flexible substrate, and the surface of a transferred graphene is very even.

A graphene transfer method according to the present disclosure also enables dry-type transfer of graphene synthesized on an uneven surface (e.g., a catalyst substrate), and improves the surface quality of the graphene obtained accordingly.

Since a grapheme obtained by a method of transferring a grapheme according to the present disclosure is doped by amine groups contained in a polymer precursor mixture so that the graphene has a high electron density (n-type doping) and a lowered surface resistance, the utilization of the graphene as an electrode is excellent.

Further, a method of transferring a graphene according to the present disclosure may control the graphene doping degree depending on ratios of a dopant material and a crosslinking agent.

Although a graphene obtained by a transfer method according to the present disclosure comprises the polymer precursor mixture, the graphene may be effectively used in an element or a device without removing the polymer precursor mixture. In this connection, as the polymer precursor mixture comprises a flexible and transparent polymer, the graphene obtained by the transfer method according to the present disclosure may be used in a flexible and transparent element and device.

In addition, a polymer precursor used in a method of transferring a graphene according to the present disclosure shows chemical stability which prevents the cured polymer precursor from being redissolved in various solvents after the polymer precursor is cured.

As a polymer precursor and a graphene used in a method of transferring a graphene according to the present disclosure have excellent flexibilities, the polymer precursor and the graphene have little change in surface resistance even after the mechanical bending test.

However, the effect that can be obtained from the present disclosure is not limited to the effects as mentioned above, and other effects may exist.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

The above and other aspects, features and other advantages of the present disclosure will be more clearly understood from the following detailed description taken in conjunction with the accompanying drawings, in which.

Figure 10:
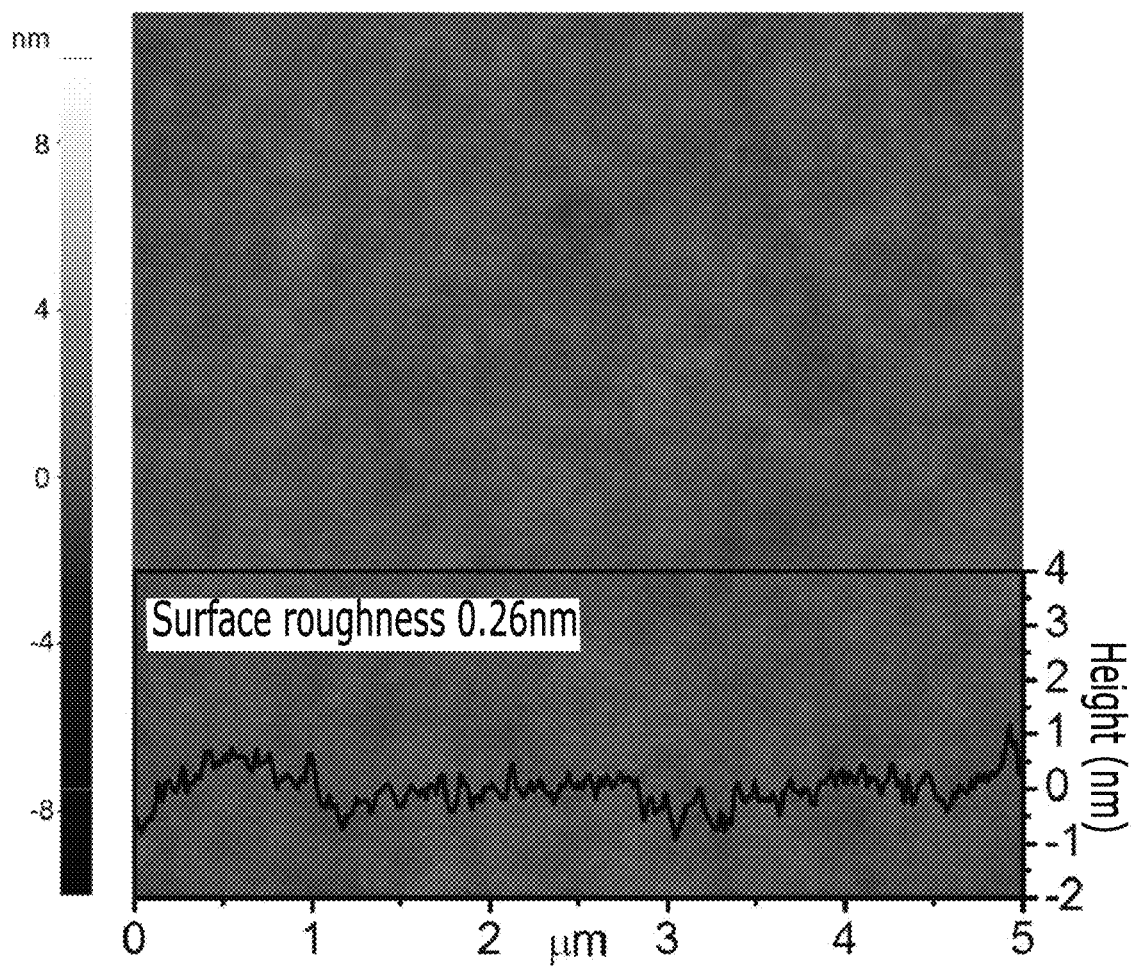
Figure 11:
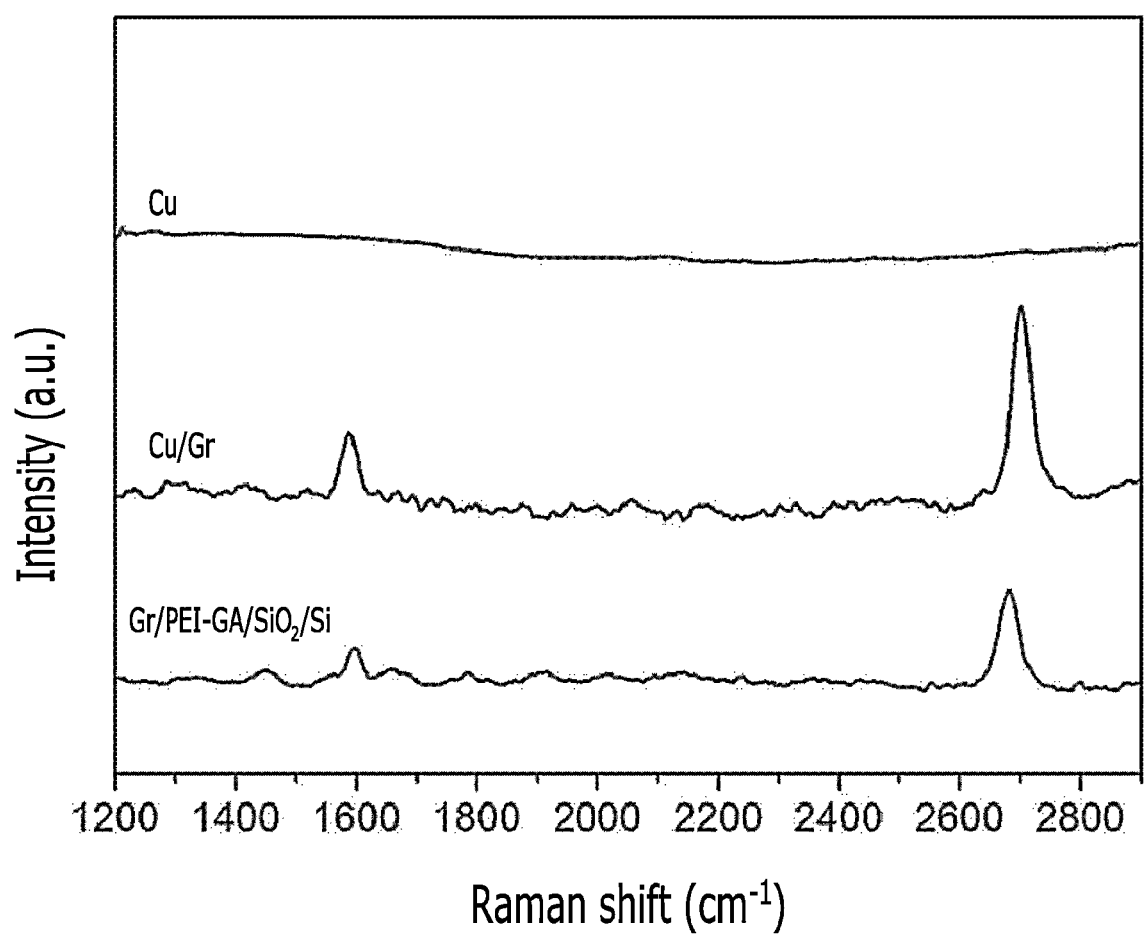
Figure 12:
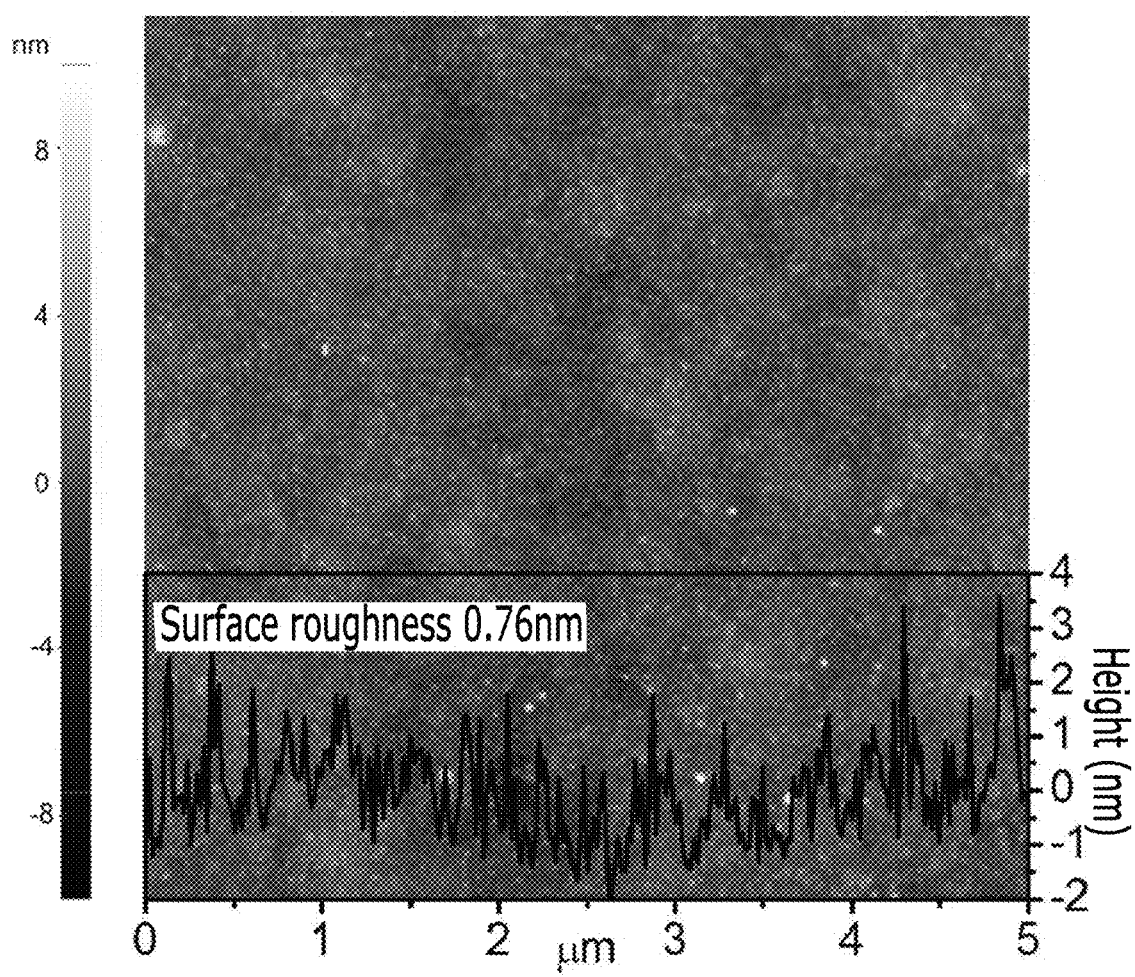
Figure 14:
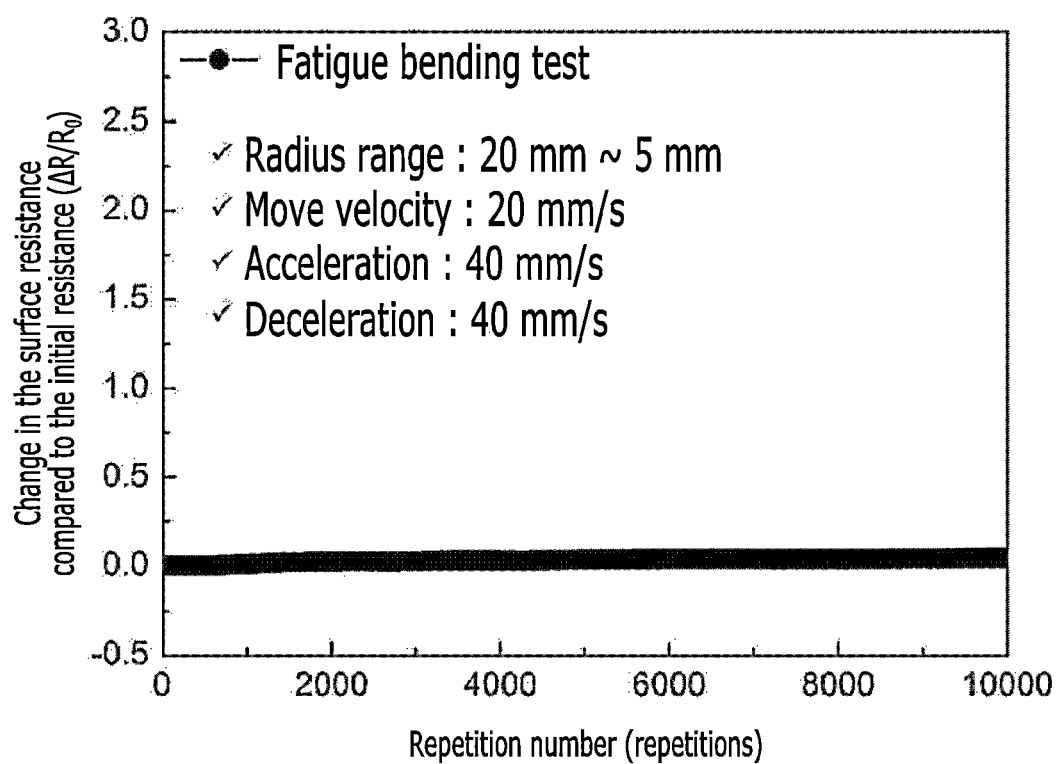
Figure 15:
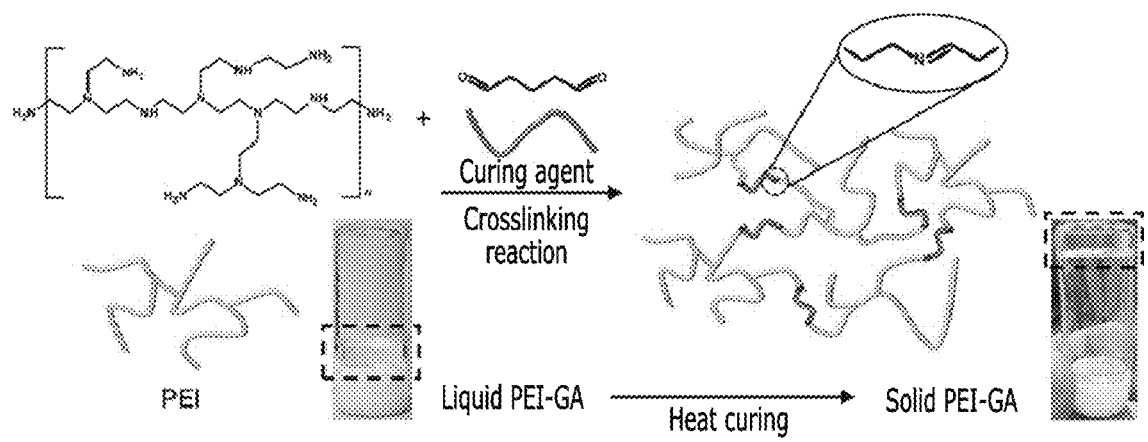
Figure 16:
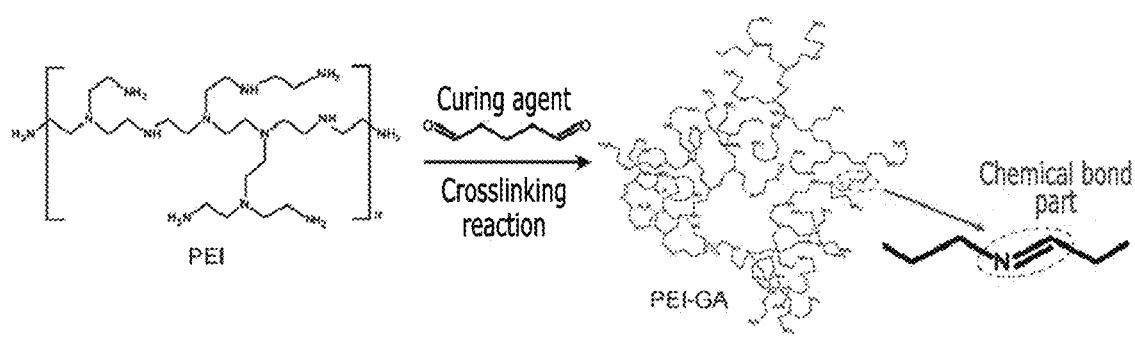
Figure 17:
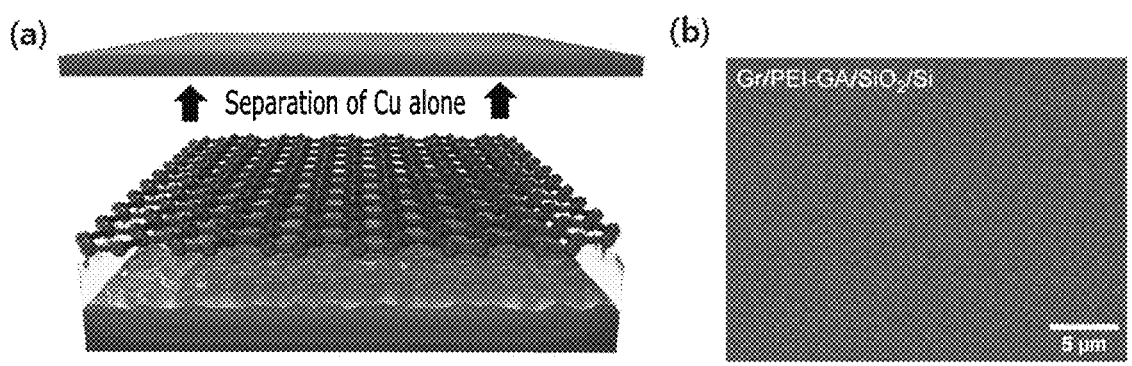
Figure 18:
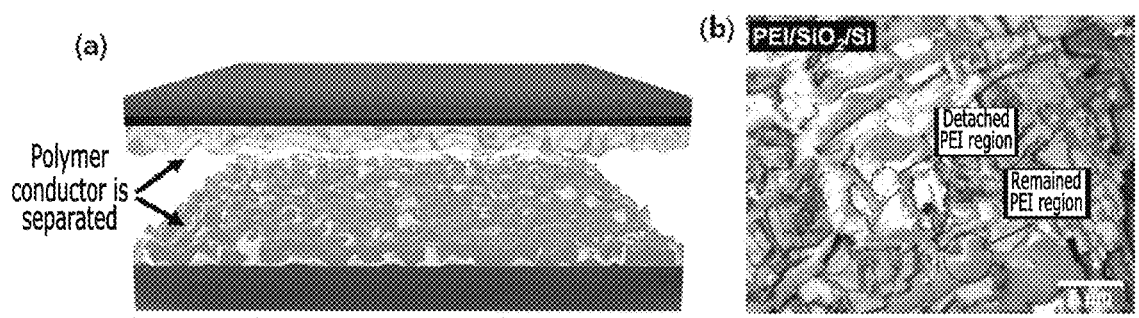
Figure 19:
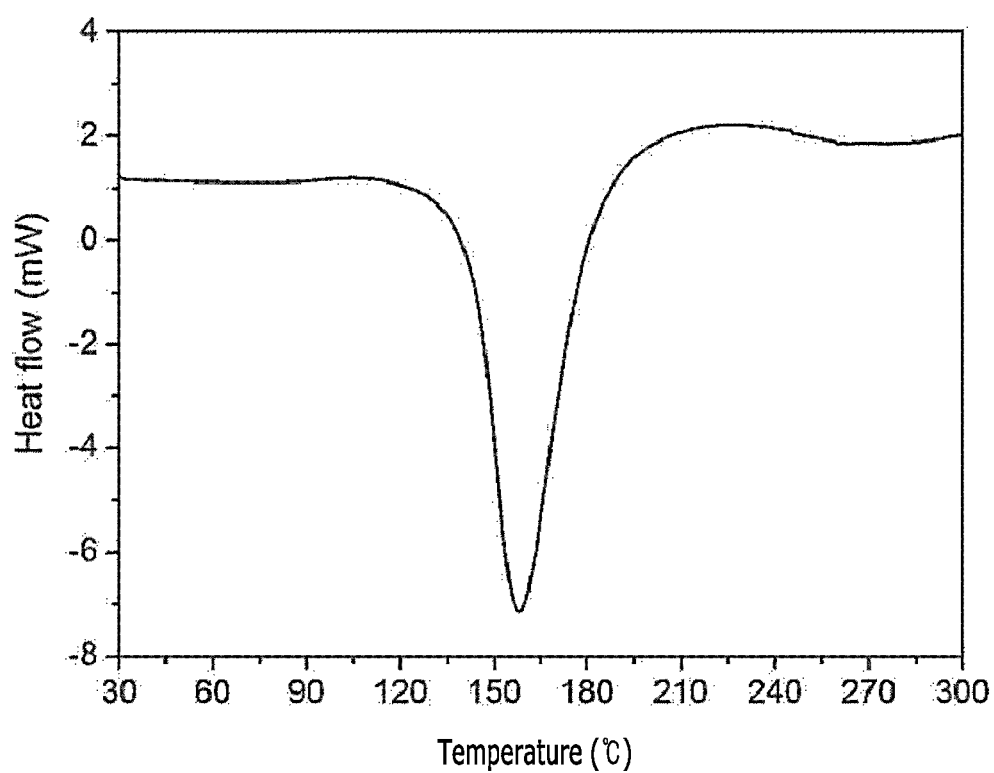
Figure 20:
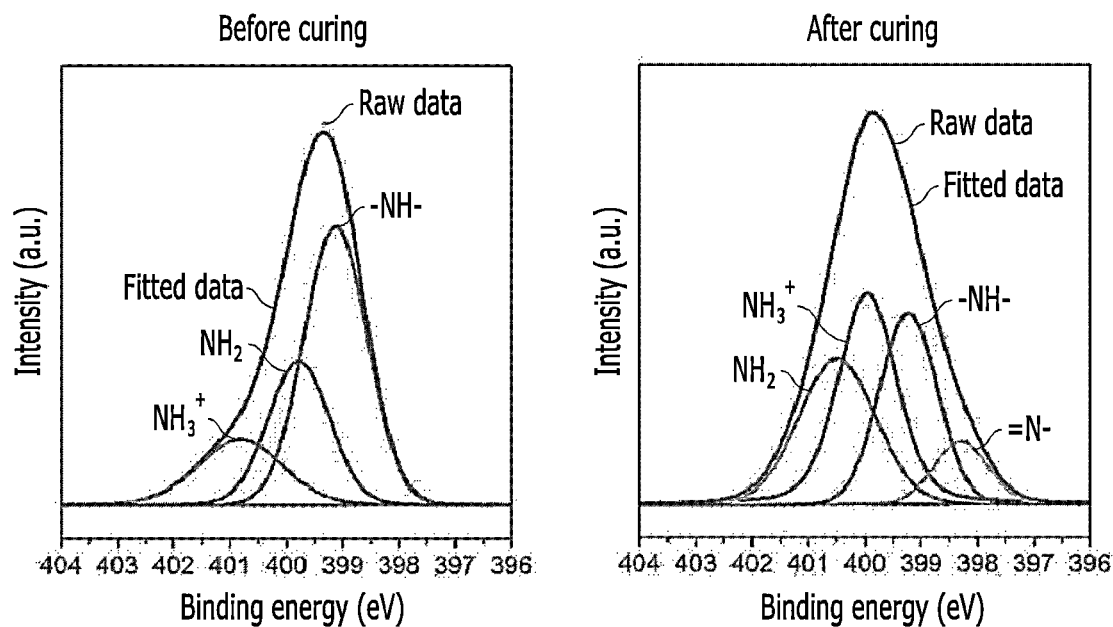
Figure 21:
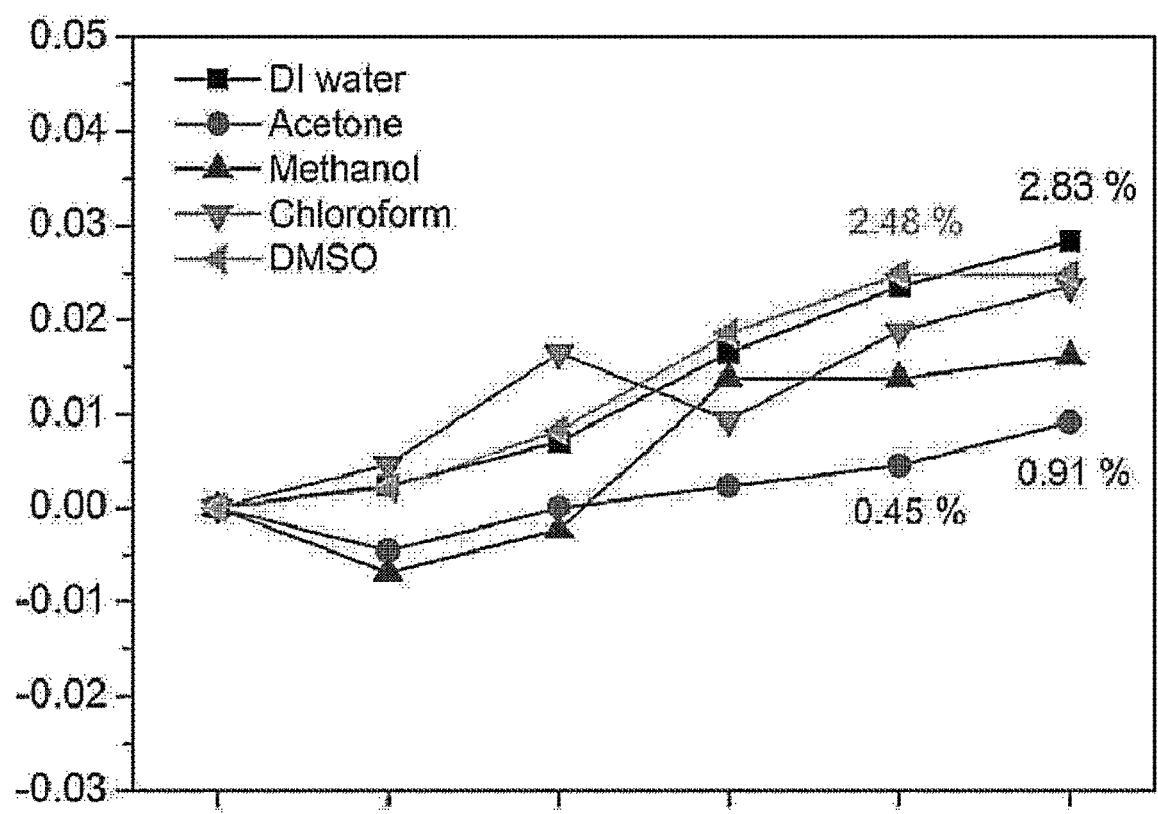
Figure 22:
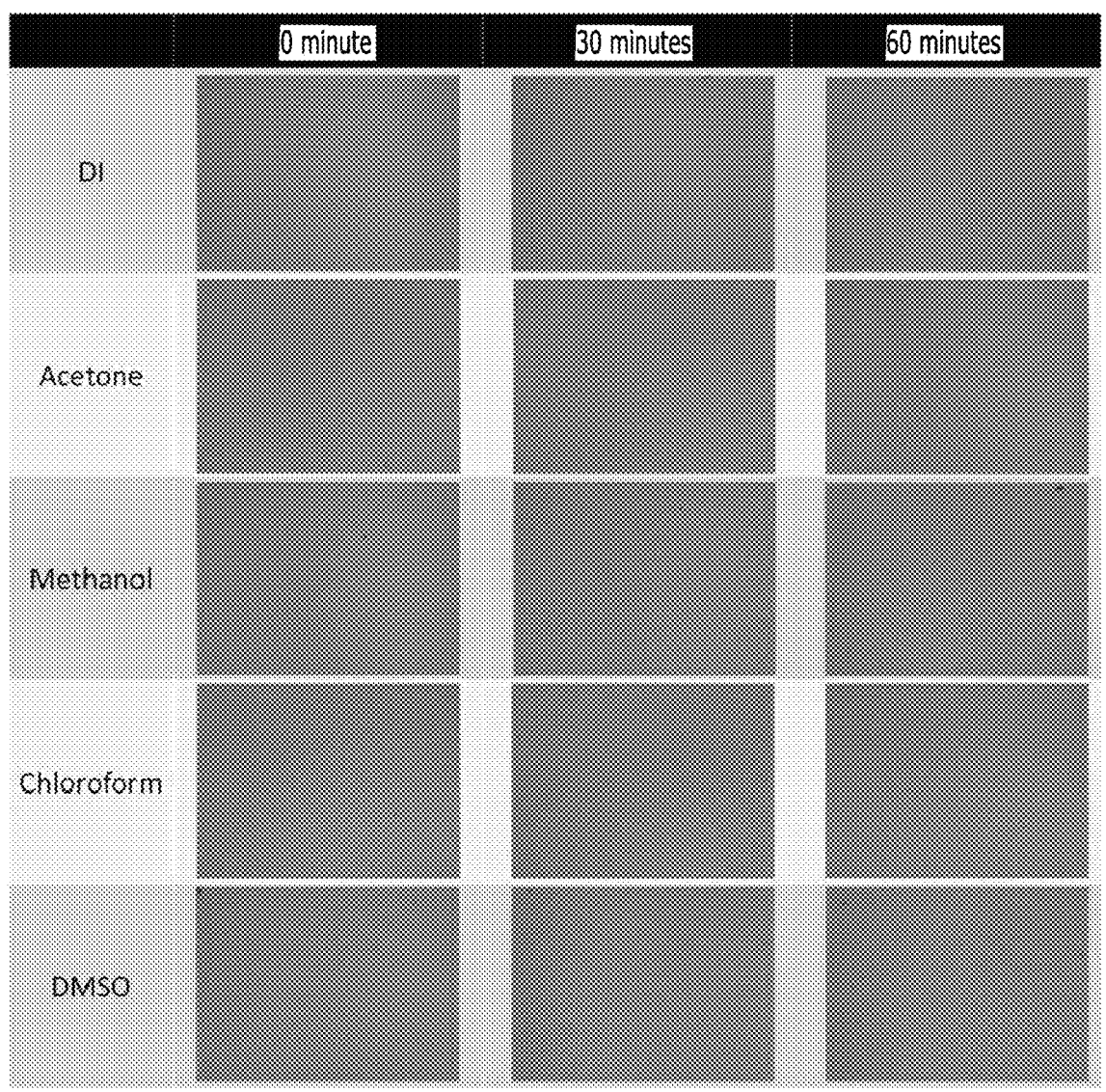
Figure 23:
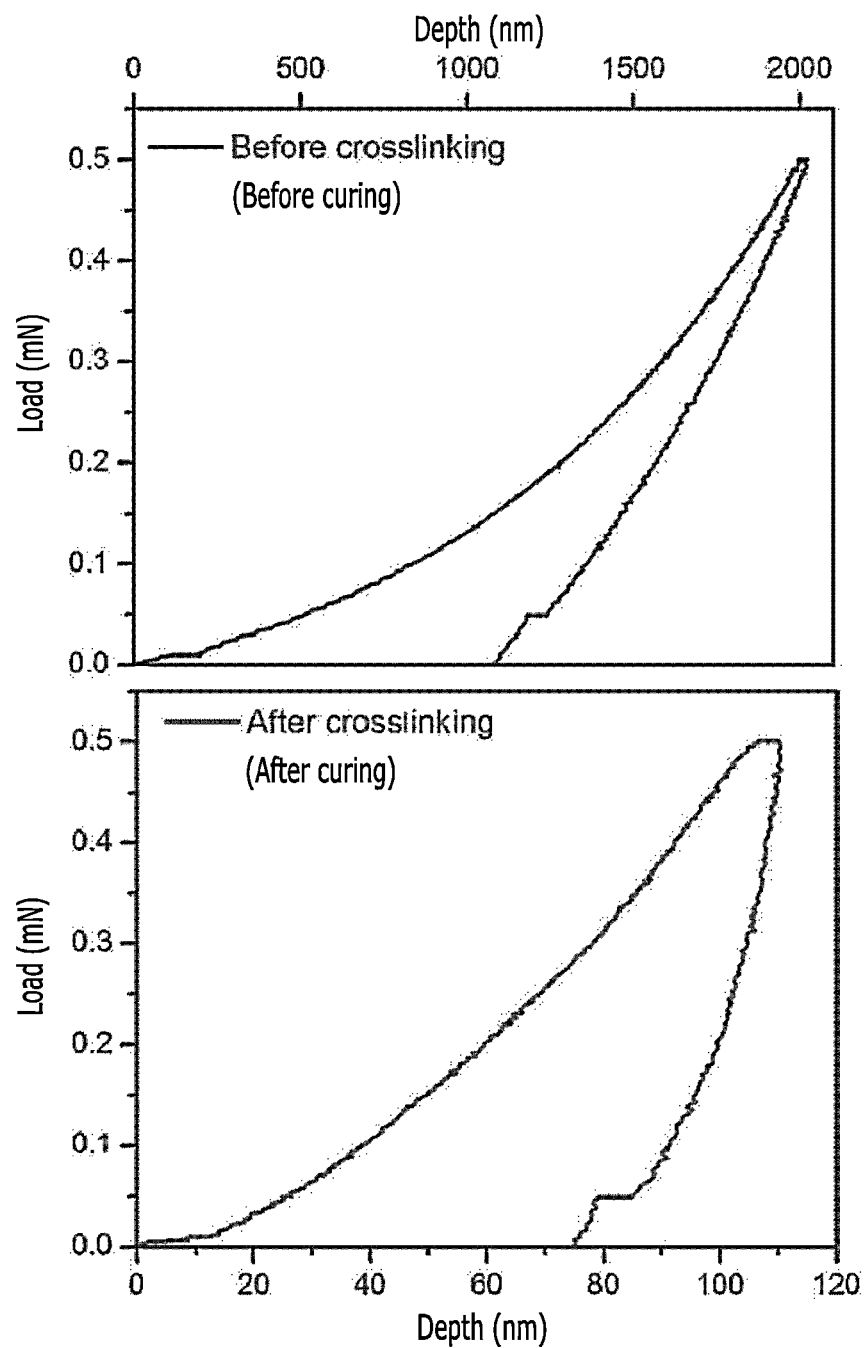
Figure 24:
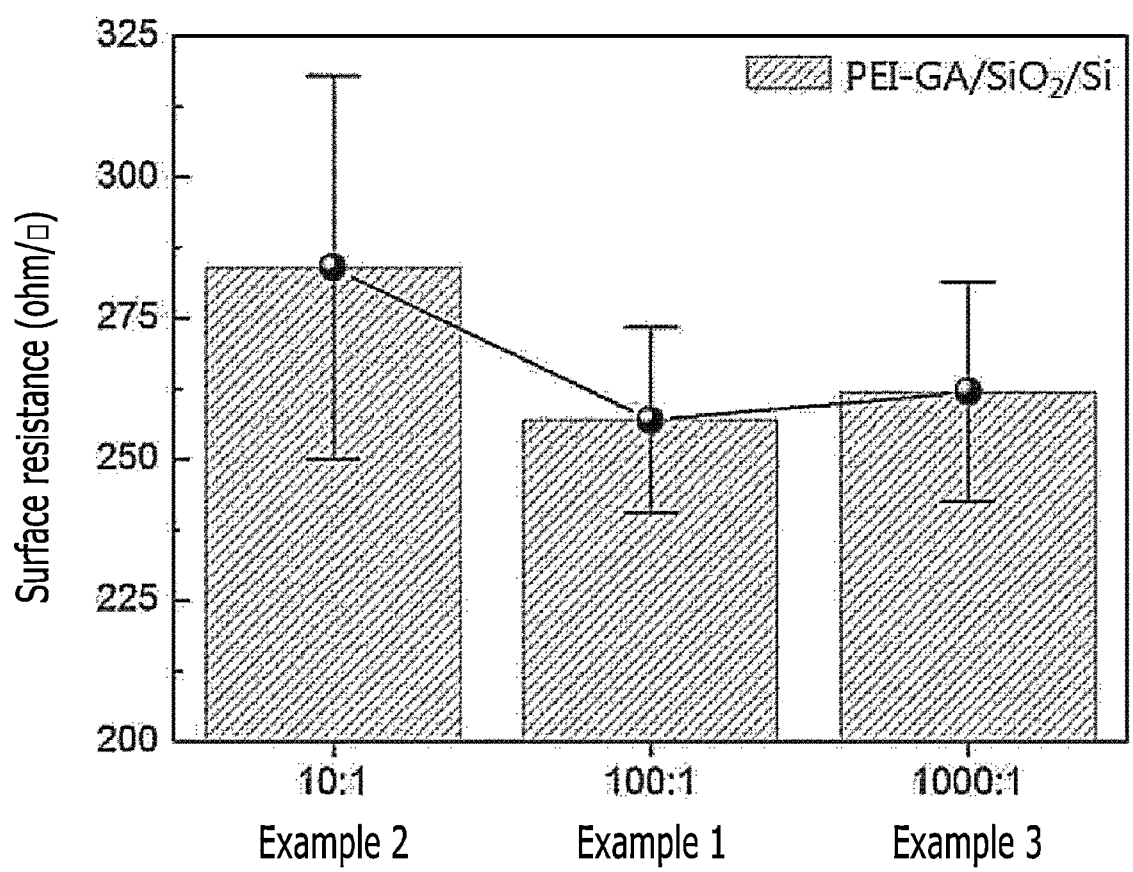
Figure 25:
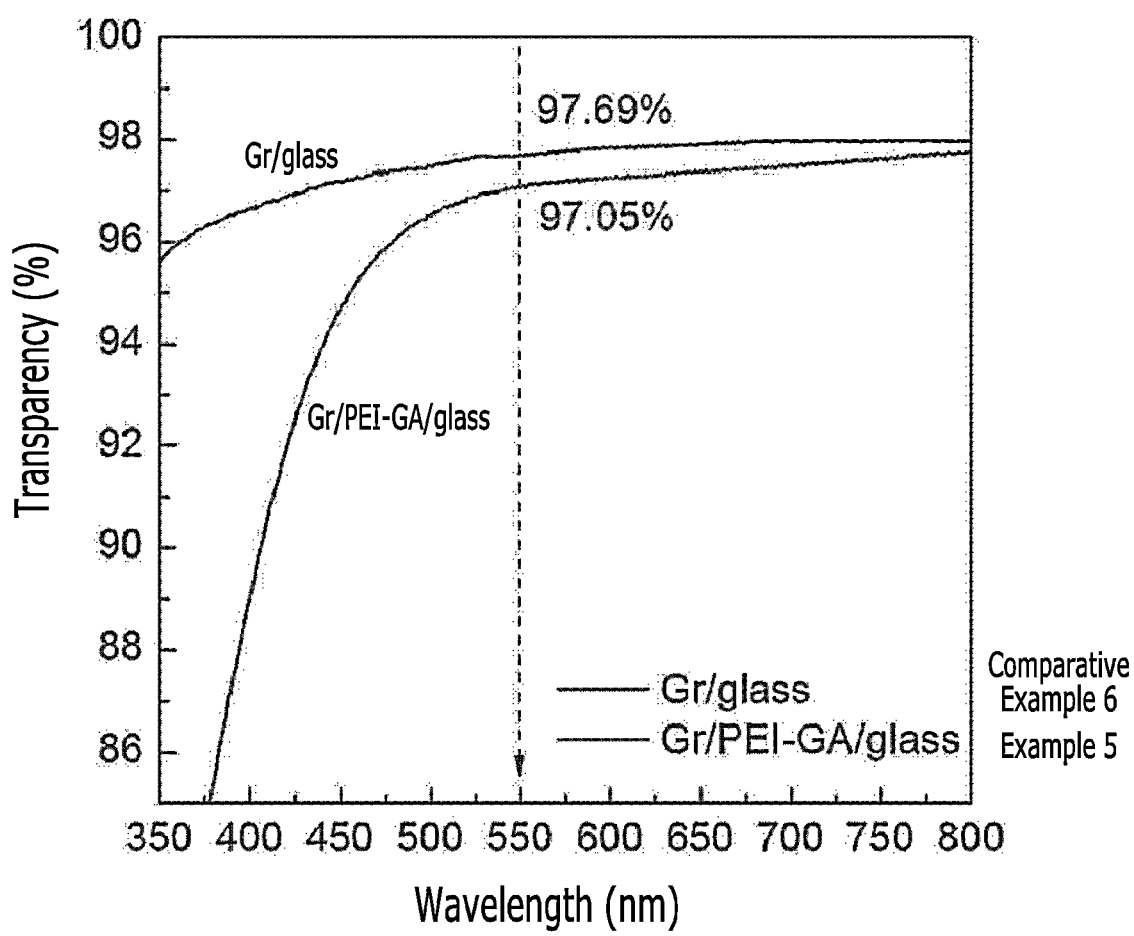
Figure 26:
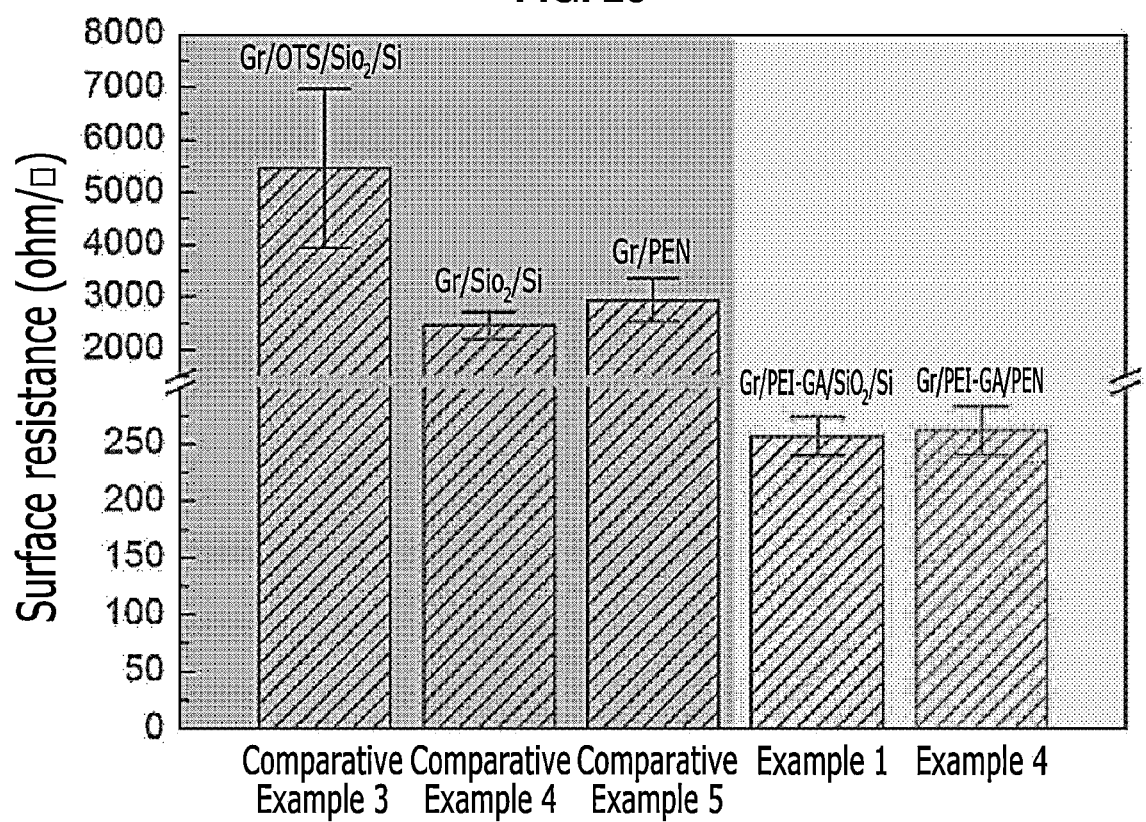
Figure 27:
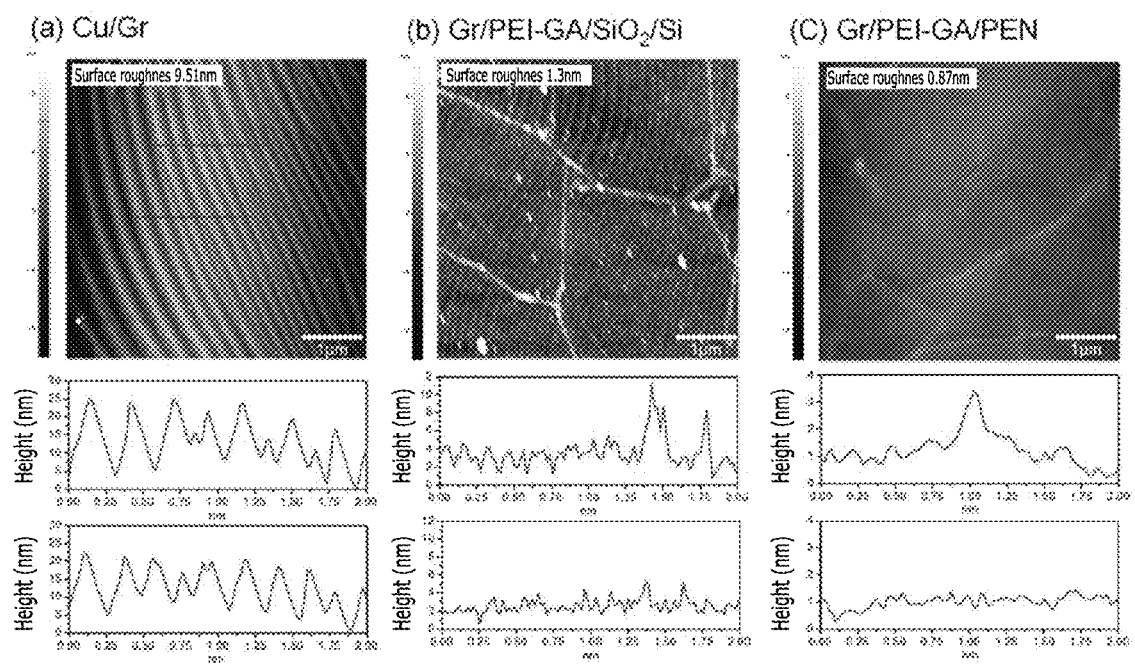

(a) of FIG. 9 is a photograph of a large-area graphene (5×5 cm$^2$) obtained by a transfer method according to an example of the present disclosure, and (b) of FIG. 9 is a surface resistance graph of (a) of FIG. 9;

FIG. 10 is atomic force microscope analysis results of the graphene obtained by a method of transferring a graphene according to an example of the present disclosure;

FIG. 11 is Raman spectroscopy analysis results of the graphene prepared by a method of transferring a graphene according to an example of the present disclosure;

FIG. 12 is atomic force microscope analysis results of the graphene obtained by a method of transferring a graphene according to an example of the present disclosure;

FIG. 13 is mechanical strength analysis results of the graphene obtained by a method of transferring a graphene according to an example of the present disclosure;

FIG. 14 is mechanical strength repeatability test results of the graphene obtained by a method of transferring a graphene according to an example of the present disclosure;

FIG. 15 is photographs and a schematic diagram of the process of curing a polymer precursor mixture according to a comparative example of the present disclosure;

FIG. 16 is a schematic diagram of the process of curing a polymer precursor mixture according to a comparative example of the present disclosure;

(a) of FIG. 17 is a schematic diagram of the step of peeling off a first substrate in a method of transferring a graphene according to an example of the present disclosure, and (b) of FIG. 17 is a scanning electron microscope (SEM) image of the graphene obtained after performing the step of (a) of FIG. 17;

(a) of FIG. 18 is a schematic diagram of the step of peeling off a first substrate in a method of transferring a graphene according to a comparative example of the present disclosure, and (b) of FIG. 18 is an SEM image obtained after performing the step of (a) of FIG. 18;

FIG. 19 is differential scanning calorimetry results for checking the curing temperature of a polymer precursor mixture in a method of transferring a graphene according to a comparative example of the present disclosure;

FIG. 20 is photoelectron spectroscopy results obtained before and after curing a polymer precursor mixture in a method of transferring a graphene according to a comparative example of the present disclosure;

FIG. 21 is chemical stability analysis results of a cured polymer precursor mixture obtained in a method of transferring a graphene according to an example of the present disclosure;

FIG. 22 is chemical stability analysis results of the cured polymer precursor mixture obtained in a method of transferring a graphene according to an example of the present disclosure;

FIG. 23 is mechanical strength difference analysis results obtained before and after curing the cured polymer precursor mixture obtained in a method of transferring a graphene according to an example of the present disclosure;

FIG. 24 is a surface resistance graph of PEI-GA/SiO$_2$/Si obtained while carrying out a method of transferring a graphene according to an example of the present disclosure;

FIG. 25 is transmittance analysis results of the graphene obtained by methods of transferring graphene according to an example and a comparative example of the present disclosure;

FIG. 26 is surface resistance comparison results of the graphene obtained by methods of transferring graphene according to examples and comparative examples of the present disclosure; and FIG. 27 is atomic force microscope analysis results of the graphene obtained by a method of transferring a graphene according to an example of the present disclosure, wherein (a) of FIG. 27 is a photograph and graphs showing that the graphene is formed on a copper substrate the surface of which is not treated, and (b) of FIG. 27 and (c) of FIG. 27 are photographs and graphs showing that the graphene formed in (a) of FIG. 27 is transferred.

DETAILED DESCRIPTION OF THE EMBODIMENT

Hereinafter, examples of the present disclosure will be described in detail with reference to the annexed drawings so that one of ordinary skill in the art to which the present disclosure pertains will easily be able to implement the present disclosure. However, the present disclosure may be implemented in various different forms and not limited to the examples described herein. A part having no relationship with the description is omitted to clearly describe the present disclosure in the drawings, and a similar constituent element is indicated by a similar reference numeral throughout the present specification.

In the whole present specification, when a part is referred as to be "connected" to the other part, the parts are not only "directly connected" to each other, but also "electrically connected" to each other while interposing another part therebetween.

In the whole present specification, when any member is positioned "on", "over", "above", "beneath", "under", and "below" the other member, this not only includes a case that the any member is brought into contact with the other member, but also includes a case that another member exists between two members.

In the whole present specification, if a prescribed part "includes" a prescribed element, this means that another element can be further included instead of excluding other elements unless any particularly opposite description exists.

When unique manufacture and material allowable errors of numerical values are suggested to mentioned meanings of terms of degrees used in the present disclosure such as "about", "substantially", etc., the terms of degrees are used as the numerical values or as a meaning near the numerical values, and the terms of degrees are used to prevent that an unscrupulous infringer unfairly uses a disclosure content in which extract or absolute numerical values are mentioned to help understanding of the present disclosure. Further, in the whole present specification, "a step doing ~" or "a step of ~" does not mean "a step for ~".

In the whole present specification, a term of "a combination thereof" included in a Markush type expression, which means a mixture or combination of one or more selected from the group consisting of elements described in the Markush type expression, means including one or more selected from the group consisting of the elements.

In the whole present specification, description of "A and/or B" means "A or B", or "A and B".

Hereinafter, a method of transferring a graphene according to the present disclosure will be described in detail with reference to embodiments, examples and drawings. However, the present disclosure is not limited to such embodiments, examples and drawings.

As a technical means for achieving the above-mentioned technical tasks, a first aspect of the present disclosure provides a method of transferring a graphene, the method comprising the steps of: forming the graphene on a first substrate; forming a polymer precursor mixture on a second substrate; disposing the graphene oppositely to the second substrate having the polymer precursor mixture formed thereon; pressing the first substrate and the second substrate while curing the polymer precursor mixture; and peeling off the first substrate.

Figure 1:
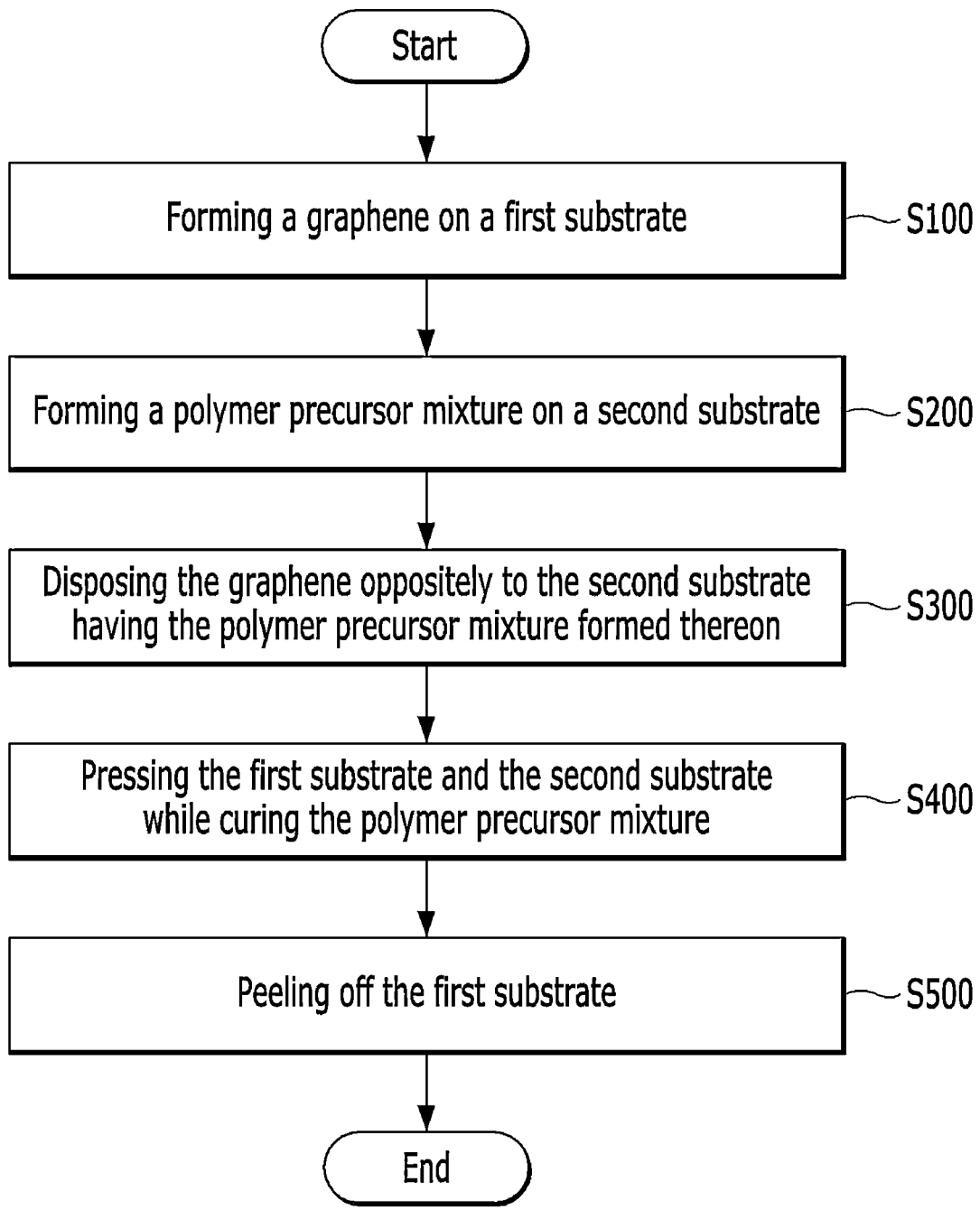
FIG. 1 is a flowchart showing a method of transferring a graphene according to an embodiment of the present disclosure.

FIG. 1 is a flowchart showing a method of transferring a graphene according to an embodiment of the present disclosure.

First, the graphene is formed on the first substrate so as to transfer the graphene (S100).

Figure 2:
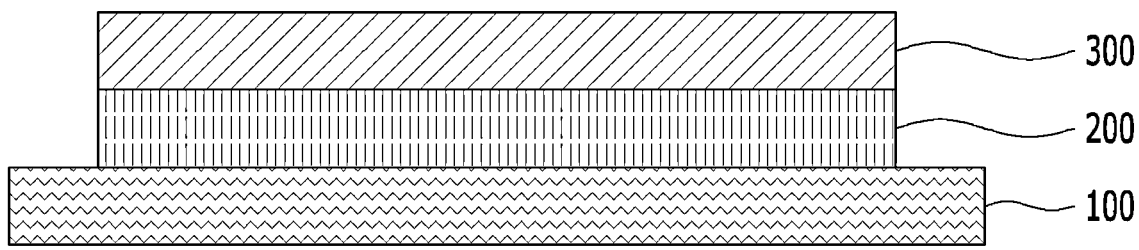
FIG. 2 is a schematic diagram of a first substrate 10 on which the graphene is formed according to a method of transferring a graphene according to an embodiment of the present disclosure.

FIG. 2 is a schematic diagram of a first substrate 10 on which the graphene is formed according to a method of transferring a graphene according to an embodiment of the present disclosure.

According to an embodiment of the present disclosure, although the step of forming the graphene 300 on the first substrate 100 may comprise forming a metal catalyst 200 on the first substrate 100, and performing a heat treatment process while injecting a gas-phase carbon supply source, the step of forming the graphene 300 on the first substrate 100 is not limited thereto.

Namely, the graphene 300 may be formed by a chemical vapor deposition method.

According to an embodiment of the present disclosure, although the first substrate 100 may include a substrate selected from the group consisting of glass, plastics, silicon, saphire, nitride, and combinations thereof, the first substrate 100 is not limited thereto.

According to an embodiment of the present disclosure, although the catalyst 200 may be selected from the group consisting of Cu, Ni, Sc, Ti, V, Cr, Mn, Fe, Co, Zn, Al, Ti, Si, Mg, Y, Zr, Nb, Mo, Tc, Ru, Rh, Pd, Ag, Cd, Hf, Ta, W, Re, Os, Ir, Pt, Au, Hg, Rf, and combinations thereof, the catalyst 200 is not limited thereto. Preferably, the catalyst 200 may be Cu or Ni.

The first substrate 100 and the catalyst 200 may comprise the same or different materials. For example, a catalytic substrate comprising the catalyst 200 may be used as the first substrate 100.

A method of forming a graphene on a substrate having a metal catalyst such as copper (Cu) or nickel (Ni) formed thereon to form a graphene with high purity and large area has been known. In order to utilize the graphene in an element or the like, the formed graphene should be delaminated and moved to a separate target substrate. However, the catalyst and the graphene are strongly coupled to each other when forming the graphene on the catalyst-formed substrate.

As it will be described later, a method of transferring a graphene according to the present disclosure may prevent occurrence of quality deterioration and defects of the graphene by effectively peeling off the catalyst 200 and the graphene 300.

Although the gas-phase carbon supply source may include a carbon-containing compound having 1 to 7 carbon atoms, the gas-phase carbon supply source is not limited thereto.

According to an embodiment of the present disclosure, although the gas-phase carbon supply source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof, the gas-phase carbon supply source is not limited thereto.

Although the heat treatment process may be performed to a temperature of 300° C. to 1,700° C., the heat treatment process is not limited thereto.

Subsequently, a polymer precursor mixture is formed on a second substrate (S200).

Figure 3:
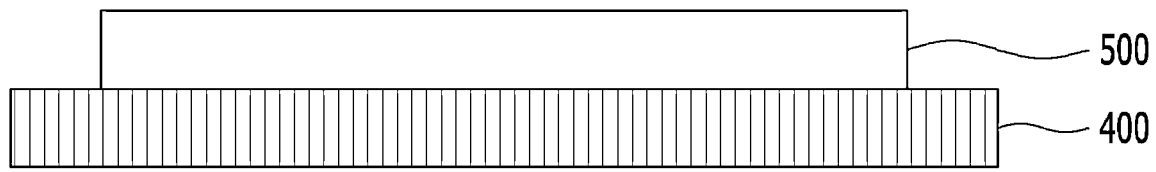
FIG. 3 is a schematic diagram of a second substrate 20 on which a polymer precursor mixture is formed according to a method of transferring a graphene according to an embodiment of the present disclosure.

FIG. 3 is a schematic diagram of a second substrate 20 on which a polymer precursor mixture 500 is formed according to a method of transferring a graphene according to an embodiment of the present disclosure.

According to an embodiment of the present disclosure, although the polymer precursor mixture 500 may contain a dopant material and a curing agent, the polymer precursor mixture 500 is not limited thereto.

According to an embodiment of the present disclosure, although the dopant material may comprise an amine group-containing polymer or a precursor thereof, the dopant material is not limited thereto. For example, the dopant material may be a polymer containing multiple amine groups, such as polyethyleneamide, poly(L-lysine hydrobromide), poly(4-aminostyrene), poly(arylamine), poly(vinylamine), hydrochloride, or the like.

According to an embodiment of the present disclosure, although the curing agent may be selected from the group consisting of glutaraldehyde, propylene dialdehyde, butyl dialdehyde, succinaldehyde, pentane-2,4-dione, acetylacetone, acetonylacetone, and combinations thereof, the curing agent is not limited thereto. The curing agent may contain two or more of aldehyde groups or ketone groups. Preferably, the curing agent may be glutaraldehyde.

According to an embodiment of the present disclosure, although the step of forming the polymer precursor mixture 500 may be carried out by a method selected from the group consisting of a spin coating method, a cast method, Langmuir-Blodgett method, an inkjet printing method, a nozzle printing method, a slot die coating method, a doctor blade coating method, a screen printing method, a dip coating method, a gravure printing method, a reverse offset printing method, a physical transfer method, a spray coating method, a chemical vapor deposition method, a thermal deposition method, a vacuum deposition method, and combinations thereof, the step of forming the polymer precursor mixture is not limited thereto. Preferably, the polymer precursor mixture 500 is formed by the spin coating method.

According to an embodiment of the present disclosure, although the second substrate 400 may be selected from the group consisting of polyethylene naphthalate, silicone, polyimide, polycarbonate, polynorbornene, polyacrylate, polyvinyl alcohol, polyethylene terephthalate, polyethersulfone, polystyrene, polypropylene, polyethylene, polyvinyl chloride, polyamide, polybutylene terephthalate, polymethacrylate, polydimethylsiloxane, and combinations thereof, the second substrate 400 is not limited thereto. Preferably, the second substrate 400 may be polyethylene naphthalate.

The polymer precursor mixture 500 may further contain a solvent. Preferably, the solvent may be methanol.

Both a soft material and a hard material may be used as the second substrate 400, and the second substrate 400 may be utilized in a soft element or device when the soft material is used as the second substrate 400.

Subsequently, the graphene-formed first substrate 10 is disposed oppositely to the polymer precursor mixture-formed second substrate 20 so that the graphene 300 is brought into contact with the polymer precursor mixture 500 (S300).

Figure 4:
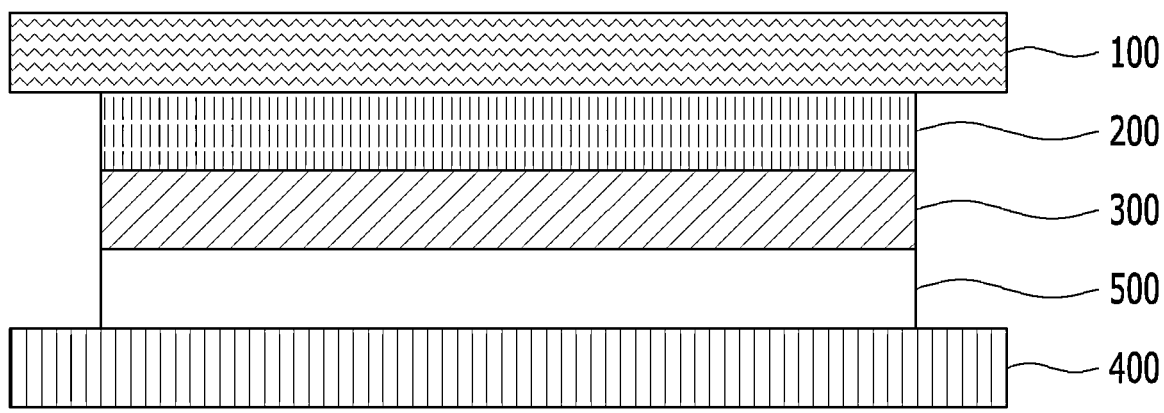
FIG. 4 is a schematic diagram of a structure 30 in which the first substrate 10 having the graphene formed thereon is disposed on the second substrate 20 having the polymer precursor mixture formed thereon according to a method of transferring a graphene according to an embodiment of the present disclosure.

FIG. 4 is a schematic diagram of a structure 30 in which the first substrate 10 having the graphene formed thereon is disposed on the second substrate 20 having the polymer precursor mixture formed thereon according to a method of transferring a graphene according to an embodiment of the present disclosure.

As the polymer precursor mixture 500 has adhesive properties, the graphene 300 is adhered onto the polymer precursor mixture 500.

Subsequently, the first substrate 10 and the second substrate 20 are pressed while the polymer precursor mixture is being cured (S400).

The first substrate 10 and the second substrate 20 may be pressed with strong binding force by applying mechanical force to top and bottom surfaces on the structure 30 while curing the polymer precursor mixture by heat and the curing agent.

According to an embodiment of the present disclosure, although the dopant material is crosslinked by the curing agent so that a net-structured polymer with strong bond may be formed, the dopant material is limited thereto.

According to an embodiment of the present disclosure, although the graphene 300 may be n-type doped while the polymer precursor mixture 500 is being cured, the graphene 300 is limited thereto.

Specifically, a net structure is formed as the dopant material is crosslinked by the curing agent while heat is being applied to the polymer precursor mixture 500. At this time, as the dopant material is brought into contact with the graphene, the graphene 300 may be doped by amine groups contained in the dopant material that does not participate in the bonding process. Further, the cured polymer precursor mixture 500($a$) forms a strong bond with the graphene 300.

According to an embodiment of the present disclosure, although the polymer precursor mixture 500 may contain the dopant material and the curing agent at a ratio of 10:1 to 1,000:1, the polymer precursor mixture 500 is not limited thereto. Preferably, the ratio may be 100:1.

Therefore, a method of transferring a graphene according to the present disclosure may control the doping degree of the graphene depending on the ratio of the dopant material and the crosslinking agent, and the resistance of the graphene is different accordingly. Further, as the crosslinking degree varies in accordance with the ratio, density and mechanical strength of the polymer precursor mixture 500 ($a$) are different.

According to an embodiment of the present disclosure, although the curing process may be performed under a temperature of 100° C. to 200° C., the curing process is not limited thereto. Preferably, the curing process may be performed at a temperature of about 160° C. When the curing process is not performed under an appropriate temperature, the crosslinking process may not be carried out smoothly.

To prevent a damage to the graphene 300 that can be occurred when applying a mechanical force, and to applying a pressure effectively, the first substrate 10 may further include a fixing plate made of a hard material.

In addition, the graphene 300 may be effectively heated and pressurized without a damage by further including a heating plate and/or a pressurization plate on the top surface and the bottom surface of the structure 30.

Subsequently, the first substrate is separated (S500).

Figure 5:
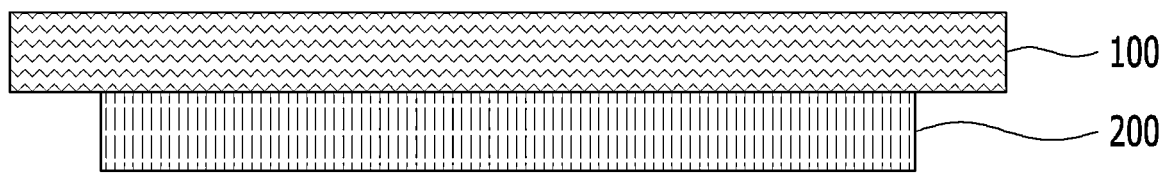
FIG. 5 is a schematic diagram of a first substrate 40 separated according to a method of transferring a graphene according to an embodiment of the present disclosure.

FIG. 5 is a schematic diagram of a first substrate 40 separated according to a method of transferring a graphene according to an embodiment of the present disclosure.

Figure 6:
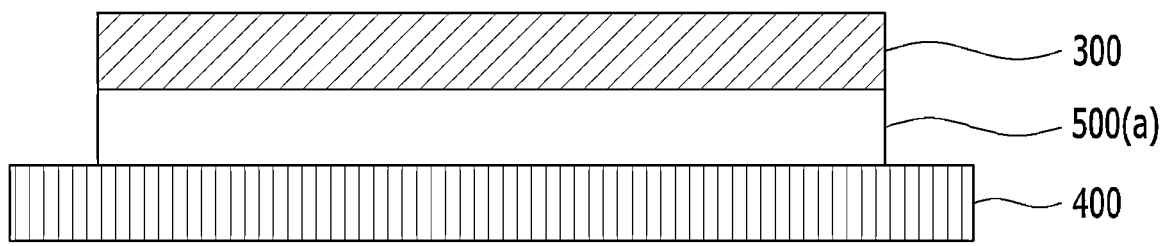
FIG. 6 is a schematic diagram of a second substrate 50 separated according to a method of transferring a graphene according to an embodiment of the present disclosure.

FIG. 6 is a schematic diagram of a second substrate 50 separated according to a method of transferring a graphene according to an embodiment of the present disclosure.

Figure 7:
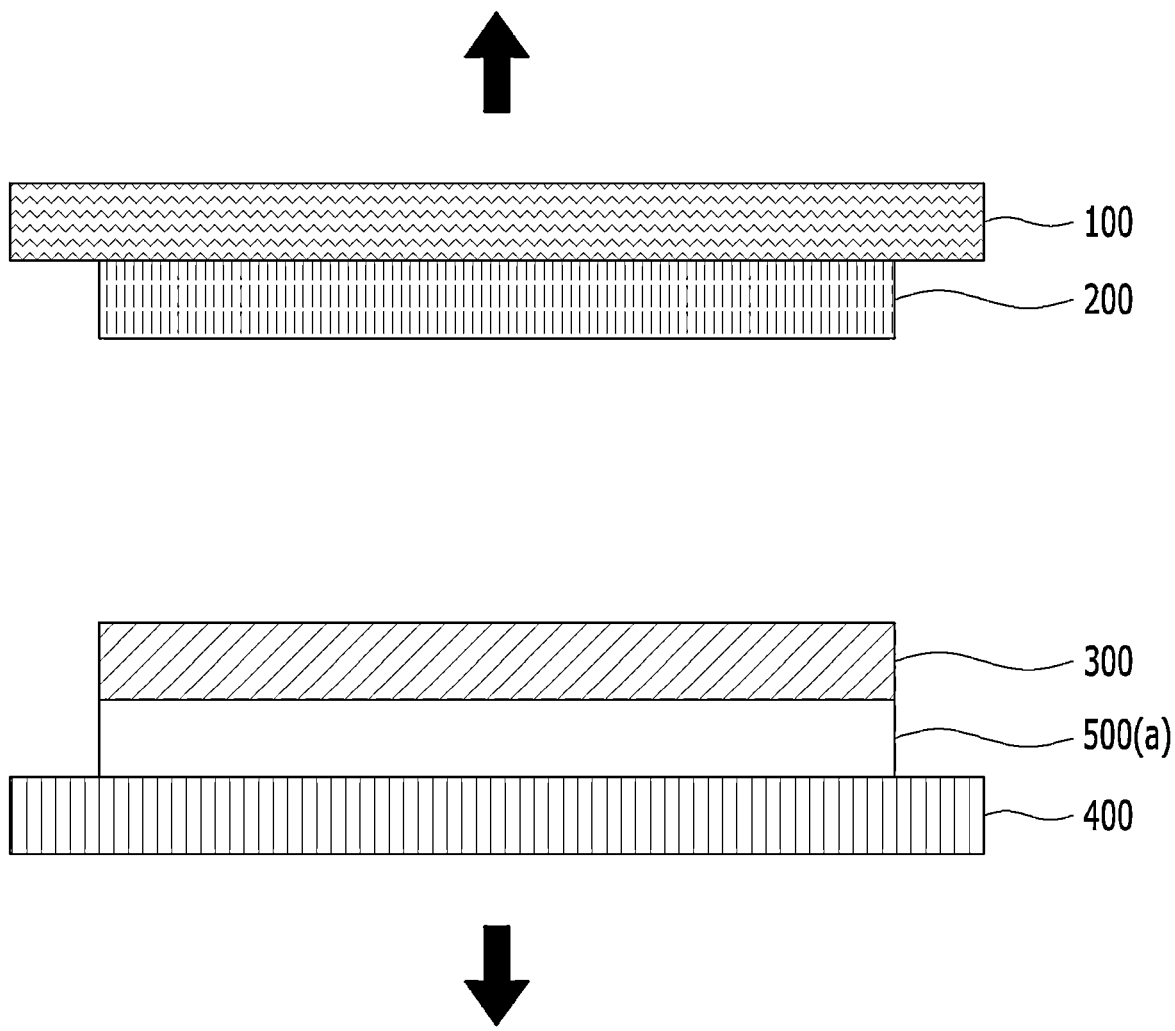
FIG. 7 is a schematic diagram of the process of peeling off the first substrate 40 and the second substrate 50 according to a method of transferring a graphene according to an embodiment of the present disclosure.

FIG. 7 is a schematic diagram of the process of peeling off the first substrate 40 and the second substrate 50 according to a method of transferring a graphene according to an embodiment of the present disclosure.

The separation process is performed by a mechanical force. As the polymer precursor mixture 500($a$) forms a strong bond by the curing process, the polymer precursor mixture 500($a$) is not broken up even when peeling off the first substrate 40 and the second substrate 50 by applying a mechanical force to the first substrate 40 and the second substrate 50. Accordingly, the graphene 300 and the first substrate 40 on which the catalyst 200 is formed are effectively separated. The first substrate 40 can be reused since this effective separation does not damage the first substrate 40 as well as the graphene 300.

Figure 8:
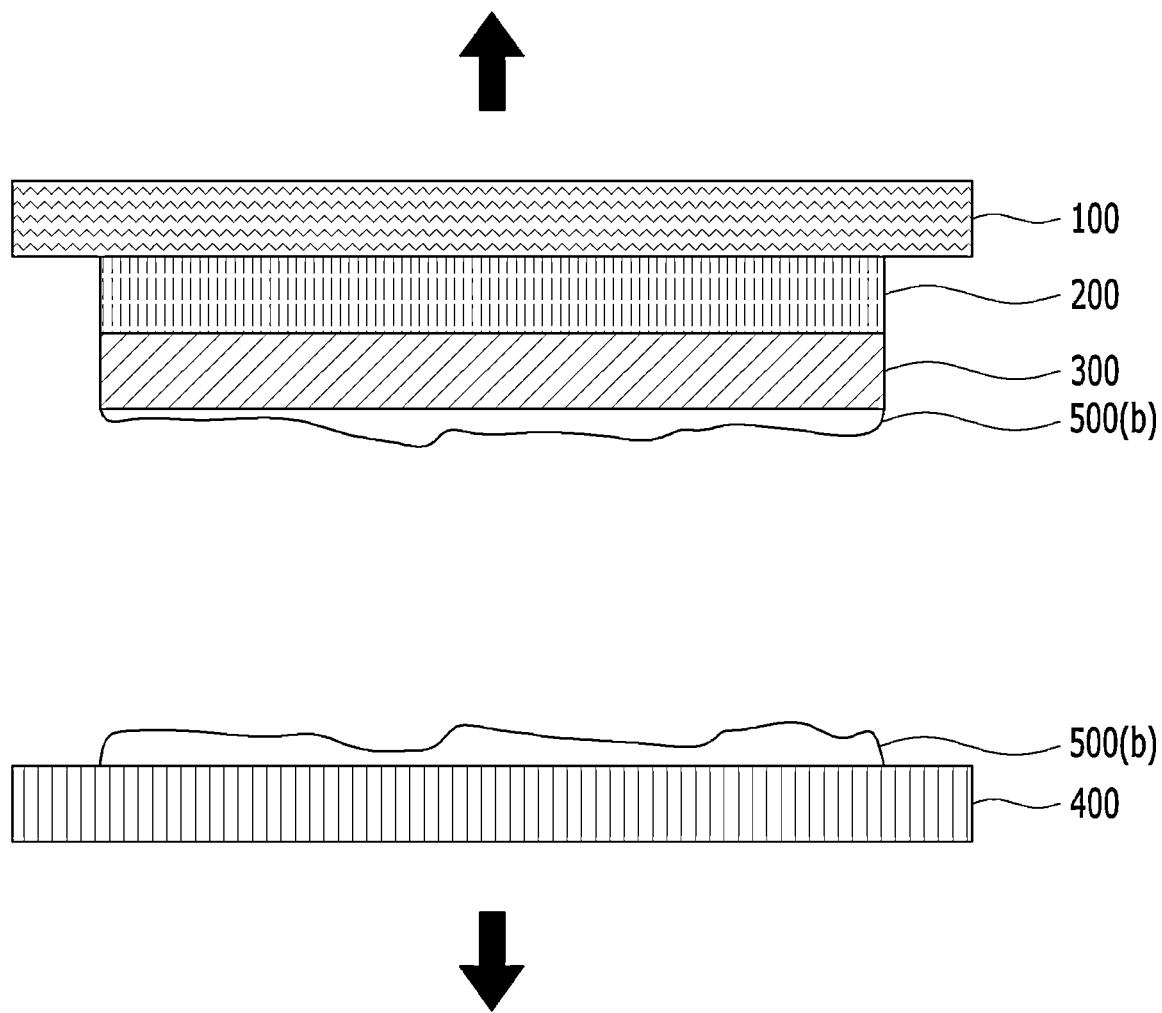
FIG. 8 is a schematic diagram of the process of peeling off the first substrate 40 and the second substrate 50 according to a method of transferring a graphene according to a comparative example of the present disclosure.

FIG. 8 is a schematic diagram of the process of peeling off the first substrate 40 and the second substrate 50 according to a method of transferring a graphene according to a comparative example of the present disclosure.

FIG. 8 shows that, since a crosslinking reaction does not occur on the polymer precursor mixture 500($b$) when carrying out a method of transferring a graphene according to the present disclosure using a polymer precursor mixture 500($b$) which does not contain the crosslinking agent, a solid net structure is not formed, and the polymer precursor mixture 500($b$) is broken up, and the graphene 300 is not delaminated from the catalyst 200 in the separation process accordingly.

Namely, since, although it is a dry-type transfer method, a method of transferring a graphene according to the present disclosure enables the graphene 300 to be delaminated from the catalyst 200 without damaging the graphene 300 by using the polymer precursor mixture 500($a$), problems possessed by an existing dry-type transfer method may be solved.

Since, although it comprises a cured polymer precursor mixture 500, the obtained graphene 50 itself not only acts as a dopant, but also is transparent and flexible, the graphene 50 may be effectively used in elements or devices without removing the polymer precursor mixture 500.

In this connection, as the polymer precursor mixture 500 contains a flexible and transparent polymer, a graphene 50 obtained by a transfer method according to the present disclosure may be used in flexible and transparent elements and devices.

A second aspect of the present disclosure provides a flexible transparent electrode comprising a graphene transferred by the method according to the first aspect of the present disclosure.

With regard to a flexible transparent electrode according to the second aspect of the present disclosure, although detailed explanations are omitted for parts overlapped with the first aspect of the present disclosure, the contents described in the first aspect of the present disclosure may be equally applied to the second aspect of the present disclosure although the explanations are omitted.

As mentioned above, as a graphene 50 obtained by a transfer method according to the present disclosure has a low resistance, and is flexible and transparent by using the polymer precursor mixture 500($a$), the graphene 50 is suitably used in a flexible transparent electrode.

Hereinafter, the present disclosure will be described in more detail through Examples, but the following Examples are only for the purpose of describing the present disclosure, and the scope of the present disclosure is not limited thereto.

[Example 1] Dry-Type Transfer (Gr/PEI-GA/SiO$_2$/Si)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed.

Specifically, a graphene (Gr) was formed on the copper substrate (Cu) by injecting a methane gas (CH$_4$) under a temperature of 1,050° C. (Cu/Gr).

Subsequently, a polymer precursor mixture (PEI-GA) was formed by performing the spin-coating process on an SiO$_2$/Si substrate (PEI-GA/SiO$_2$/Si). A ratio of PEI to GA in the polymer precursor mixture was 100:1.

Subsequently, after contacting the polymer precursor mixture (PEI-GA) on the PEI-GA/SiO$_2$/Si with the graphene (Gr) on the Cu/Gr and vertically applying a mechanical force to the polymer precursor mixture (PEI-GA) on the PEI-GA/SiO$_2$/Si contacted with the graphene (Gr) on the Cu/Gr, thereby performing a heat treatment process (a hot press method) under a temperature of 160° C. in a state that the polymer precursor mixture (PEI-GA) on the PEI-GA/SiO$_2$/Si and the graphene (Gr) on the Cu/Gr were pressed to each other, the PEI-GA was cured, and the Or and the PEI-GA were strongly bonded to each other (Cu/Gr/PEI-GA/SiO$_2$/Si).

Finally, the process of delaminating the graphene (Gr) was proceeded by applying a mechanical force and peeling off the copper substrate (Cu) from the Cu/Gr/PEI-GA/SiO$_2$/Si (Gr/PEI-GA/SiO$_2$/Si).

(a) of FIG. 9 is a photograph of a large-area graphene (5×5 cm$^2$) obtained by a transfer method according to an example of the present disclosure, and (b) of FIG. 9 is a surface resistance graph of (a) of FIG. 9.

Referring to FIG. 9, it may be confirmed that a graphene (Gr/PEI-GA/SiO$_2$/Si) obtained using a polymer precursor mixture is uniformly transferred by having a low average surface resistance value of 258.8 ohm/sq on a large area of 5×5 cm$^2$, and a standard deviation of 12.5.

FIG. 10 is atomic force microscope analysis results of the graphene obtained by a method of transferring a graphene according to an example of the present disclosure. It may be checked through FIG. 10 that the transferred graphene (Gr/PEI-GA/SiO$_2$/Si) is very flat by having a surface roughness of 0.26 nm.

FIG. 11 is Raman spectroscopy analysis results of the graphene prepared by a method of transferring a graphene according to an example of the present disclosure. Judging from whether there is a carbon peak (G peak: 1,580 cm$^{-1}$, 2D peak: 2,800 cm$^{-1}$) or not, it may be confirmed that the Gr/PEI-GA/SiO$_2$/Si is formed by transferring the graphene (Gr) from the graphene (Cu/Gr) formed on the copper substrate to the PEI-GA/SiO$_2$/Si.

[Example 2] Dry-Type Transfer (Gr/PEI-GA/SiO$_2$/Si)

A dry-type transfer process was performed in the same manner as in Example 1 except that the ratio of PEI to GA in the polymer precursor mixture (PEI-GA) was 10:1.

[Example 3] Dry-Type Transfer (Gr/PEI-GA/SiO$_2$/Si)

A dry-type transfer process was performed in the same manner as in Example 1 except that the ratio of PEI to GA in the polymer precursor mixture (PEI-GA) was 1,000:1.

[Example 4] Dry-Type Transfer (Gr/PEI-GA/PEN)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas (CH$_4$) under a temperature of 1,050° C. (Cu/Gr).

Subsequently, a polymer precursor mixture (PEI-GA) was formed by performing the spin-coating process on a polyethylene naphthalate substrate (PEN) (PEI-GA/PEN), A ratio of PEI to GA in the polymer precursor mixture was 100:1.

Subsequently, after contacting the polymer precursor mixture (PEI-GA) on the PEI-GA/PEN with the graphene (Gr) on the Cu/Gr and vertically applying a mechanical force to the polymer precursor mixture (PEI-GA) on the PEI-GA/PEN contacted with the graphene (Gr) on the Cu/Gr, thereby performing a heat treatment process (a hot press method) under a temperature of 160° C. in a state that the polymer precursor mixture (PEI-GA) on the PEI-GA/PEN and the graphene (Gr) on the Cu/Gr were pressed to each other, the PEI-GA was cured, and the Gr and the PEI-GA were strongly bonded to each other (Cu/Gr/PEI-GA/PEN).

Finally, the process of delaminating the graphene (Gr) was proceeded by applying a mechanical force and peeling off the copper substrate (Cu) from the Cu/Gr/PEI-GA/PEN (Gr/PEI-GA/PEN).

FIG. 12 is atomic force microscope analysis results of the graphene obtained by a method of transferring a graphene according to an example of the present disclosure. It may be checked through FIG. 12 that the transferred graphene (Gr/PEI-GA/PEN) is very flat by having a surface roughness of 0.76 nm.

FIG. 13 is mechanical strength analysis results of the graphene obtained by a method of transferring a graphene according to an example of the present disclosure. It may be checked through FIG. 13 that, when bending the transferred graphene (Gr/PEI-GA/PEN) in an outer direction, a resistance strain critical point was 2 mm, and the resistance changes (increases as much as 11%) from this point on. When this is converted and calculated into a tensile strain, it may be confirmed that, although a tensile stress of up to 1.23% (=3 mm) is applied, the resistance does not change, and increases from a tensile stress of up to 1.84% or more. This is because the graphene (Gr) and the substrate (PEN) are flexible, and, moreover, a polymer precursor mixture (PEI-GA/PEN) containing a curing agent is very flexible.

FIG. 14 is mechanical strength repeatability test results of the graphene obtained by a method of transferring a graphene according to an example of the present disclosure. Specifically, it may be checked that the resistance hardly changes although the tensile stress is applied to a radius of 5 mm to 20 mm, and this process is repeated 10,000 times. This is because the graphene (Gr) and the substrate (PEN)

are flexible, and, moreover, a polymer precursor mixture (PEI-GA/PEN) containing a curing agent is very flexible.

[Example 5] Dry-Type Transfer (Gr/PEI-GA/Glass)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas ($CH_4$) under a temperature of 1,050° C. (Cu/Gr).

Subsequently, a polymer precursor mixture (PEI-GA) was formed by performing the spin-coating process on a glass substrate (glass) (PEI-GA/glass), A ratio of PEI to GA in the polymer precursor mixture was 100:1.

Subsequently, after contacting the polymer precursor mixture (PEI-GA) on the PEI-GA/Glass with the graphene (Gr) on the Cu/Gr and vertically applying a mechanical force to the polymer precursor mixture (PEI-GA) on the PEI-GA/Glass contacted with the graphene (Gr) on the Cu/Gr, thereby performing a heat treatment process (a hot press method) under a temperature of 160° C. in a state that the polymer precursor mixture (PEI-GA) on the PEI-GA/Glass and the graphene (Gr) on the Cu/Gr were pressed to each other, the PEI-GA was cured, and the Gr and the PEI-GA were strongly bonded to each other (Cu/Gr/PEI-GA/glass).

[Example 6] Dry-Type Transfer (Gr/PEI-GA/$SiO_2$/Si)

A dry-type transfer process was performed in the same manner as in Example 1 except that a copper substrate having a terrace existed therein was used as the substrate had not been planarized by proceeding with abnormal grain growth.

[Example 7] Dry-Type Transfer (Gr/PEI-GA/PEN)

A dry-type transfer process was performed in the same manner as in Example 4 except that a copper substrate having a terrace existed therein was used as the substrate had not been planarized by proceeding with abnormal grain growth.

[Comparative Example 1] Dry-Type Transfer (Gr/PEI/$SiO_2$/Si)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas ($CH_4$) under a temperature of 1,050° C. (Cu/Gr).

Subsequently, a polyetherimide (PEI) was formed by performing the spin-coating process on an $SiO_2$/Si substrate (PEI/$SiO_2$/Si).

Subsequently, after contacting the PEI on the PEI/$SiO_2$/Si with the graphene (Gr) on the Cu/Gr, a heat treatment process (a hot press method) was performed under a temperature of 160° C. in a state that the PEI on the PEI/$SiO_2$/Si and the graphene (Gr) on the Cu/Gr were pressed to each other by vertically applying a mechanical force to the PEI on the PEI/$SiO_2$/Si contacted with the graphene (Gr) on the Cu/Gr (Cu/Gr/PEI/$SiO_2$/Si).

Finally, the process of delaminating the graphene (Gr) was proceeded by applying a mechanical force and peeling off the copper substrate (Cu) from the Cu/Gr/PEI/$SiO_2$/Si (Gr/PEI/$SiO_2$/Si).

[Comparative Example 2] Curing of a Polymer Precursor Mixture (PEI-GA)

The curing process was performed in the same manner as in Example 1 except that the step of forming and curing the PEI-GA within a container was carried out alone.

FIG. 15 is photographs and a schematic diagram of the process of curing a polymer precursor mixture according to a comparative example of the present disclosure.

FIG. 16 is a schematic diagram of the process of curing a polymer precursor mixture according to a comparative example of the present disclosure.

Referring to FIGS. 15 and 16, it may be seen that, when heat is applied to a mixture obtained after mixing PEI in a liquid state with GA in the other liquid state, the mixture forms a covalent bond through the dehydration and condensation reaction, and is crosslinked to become a solid state.

[Comparative Example 3] Wet-Type Transfer (Gr/OTS/$SiO_2$/Si)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed.

Specifically, a graphene (Gr) was formed on the copper substrate (Cu) by injecting a methane gas ($CH_4$) under a temperature of 1,050° C. (Cu/Gr).

Subsequently, a poly(methyl 2-methylpropenoate) (PMMA) supporting layer was coated on the Cu/Gr through the spin-coating process (Cu/Gr/PMMA).

Subsequently, after dissolving Cu by floating the Cu/Gr/PMMA in an ammonium persulfate {$(NH_4)_2S_2O_8$} solution, ammonium persulfate on the surface of the graphene was washed out by floating the PMMA/Gr in deionized water (PMMA/Gr).

Meanwhile, an OTS self-assembled layer was formed on the surface of $SiO_2$ on the $SiO_2$/Si substrate by dipping an $SiO_2$/Si substrate in an octadecyl trichlorosilane (OTS) solution for 3 hours (OTS-$SiO_2$/Si).

After scooping up the PMMA/Gr floating in the deionized water with the OTS-$SiO_2$/Si, the PMMA/Gr on the OTS-$SiO_2$/Si was heat-treated (baked) on a hot plate for 3 hours so as to remove water (PMMA/Gr/OTS-$SiO_2$/Si).

Subsequently, the PMMA was removed by impregnating the PMMA/Gr/OTS-$SiO_2$/Si with acetone (Gr/OTS-$SiO_2$/Si).

[Comparative Example 4] Wet-Type Transfer (Gr/$SiO_2$/Si)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas (CH$_4$) under a temperature of 1,050° C. (Cu/Gr).

Subsequently, a poly(methyl 2-methylpropenoate) (PMMA) supporting layer was coated on the Cu/Gr through the spin-coating process (Cu/Gr/PMMA).

Subsequently, after dissolving Cu by floating the Cu/Gr/PMMA in an ammonium persulfate {(NH$_4$)$_2$S$_2$O$_8$} solution, ammonium persulfate on the surface of the graphene was washed out by floating the PMMA/Gr in deionized water (PMMA/Gr).

After scooping up the PMMA/Gr floating in the deionized water with SiO$_2$/Si, the PMMA/Gr on the SiO$_2$/Si was heat-treated (baked) on a hot plate for 3 hours so as to remove water (PMMA/Gr/SiO$_2$/Si).

Subsequently, the PMMA was removed by impregnating the PMMA/Gr/SiO$_2$/Si with acetone (Gr/SiO$_2$/Si).

[Comparative Example 5] Wet-Type Transfer (Gr/PEN)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas (CH$_4$) under a temperature of 1,050° C. (Cu/Gr).

Subsequently, a poly(methyl 2-methylpropenoate) (PMMA) supporting layer was coated on the Cu/Gr through the spin-coating process (Cu/Gr/PMMA).

Subsequently, after dissolving Cu by floating the Cu/Gr/PMMA in an ammonium persulfate {(NH$_4$)$_2$S$_2$O$_8$} solution, ammonium persulfate on the surface of the graphene was washed out by floating the PMMA/Gr in deionized water (PMMA/Gr).

After scooping up the PMMA/Gr floating in the deionized water with PEN, the PMMA/Gr on the PEN was heat-treated (baked) on a hot plate for 3 hours so as to remove water (PMMA/Gr/PEN).

Subsequently, the PMMA was removed by impregnating the PMMA/Gr/PEN with acetone (Gr/PEN).

[Comparative Example 6] Wet-Type Transfer (Gr/Glass)

The substrate was planarized by performing a heat treatment process on a commercially available copper substrate (Cu) at a temperature of 1,030° C. to 1,050° C., thereby proceeding with abnormal grain growth (Cu).

Subsequently, the chemical vapor deposition method was performed. Specifically, a graphene (Gr) was formed on the copper substrate (Cu) by injecting a methane gas (CH$_4$) under a temperature of 1,050° C. (Cu/Gr).

Subsequently, a poly(methyl 2-methylpropenoate) (PMMA) supporting layer was coated on the Cu/Gr through the spin-coating process (Cu/Gr/PMMA).

Subsequently, after dissolving Cu by floating the Cu/Gr/PMMA in an ammonium persulfate (NH$_4$)$_2$S$_2$O$_8$ solution, ammonium persulfate on the surface of the graphene was washed out by floating the PMMA/Gr in deionized water (PMMA/Gr).

After scooping up the PMMA/Gr floating in the deionized water with glass, the PMMA/Gr on the glass was heat-treated (baked) on a hot plate for 3 hours so as to remove water (PMMA/Gr/glass).

Subsequently, the PMMA was removed by impregnating the PMMA/Gr/glass with acetone (Gr/glass).

Experimental Example 1

Surfaces after the transfer process of Example 1 and Comparative Example 1 were analyzed through a scanning electron microscope (SEM).

(a) of FIG. 17 is a schematic diagram of the step of peeling off a first substrate in a method of transferring a graphene according to an example of the present disclosure, and (b) of FIG. 17 is an SEM image of the graphene obtained after performing the step of (a) of FIG. 17. It may be confirmed through this that a polymer precursor mixture (PEI-GA) and a graphene (Gr) are not separated, and the graphene (Gr) is separated from a copper substrate (Cu) without leaving residues. This is because the PEI-GA is cured, and strongly coupled to amine groups contained in PEI by electron transfer reaction of the graphene (Gr).

(a) of FIG. 18 is a schematic diagram of the step of peeling off a first substrate in a method of transferring a graphene according to a comparative example of the present disclosure, and (b) of FIG. 18 is an SEM image obtained after performing the step of (a) of FIG. 18. It may be confirmed through this that the graphene is not transferred as the polymer conductor (PEI) is separated while it is being broken since PEI, i.e., a polymer conductor, is not solidified when there is not a curing agent (GA).

[Experimental Example 2] Comparing PEI-GA Before Curing and PEI-GA after Curing

With regard to PEI-GA produced according to Comparative Example 2, physical properties of PEI-GA before curing and PEI-GA after curing were compared.

FIG. 19 is differential scanning calorimetry results for checking the curing temperature of a polymer precursor mixture in a method of transferring a graphene according to a comparative example of the present disclosure. It may be seen through this that PEI and GA are coupled (crosslinked) at 158° C.

FIG. 20 is photoelectron spectroscopy results obtained before and after curing a polymer precursor mixture in a method of transferring a graphene according to a comparative example of the present disclosure. It may be checked through this that PEI and GA are crosslinked through an imide bond by performing the curing process, and it may be seen that chemical bond has an effect on the transfer of the graphene.

FIG. 21 is stability analysis results of a cured polymer precursor mixture obtained in a method of transferring a graphene according to an example of the present disclosure. Specifically, the surface resistance was analyzed using a 4-point probe measurement method. It may be checked through this that, although it is impregnated with various solvents for 60 minutes, a heat cured PEI-GA is not dissolved, and the resistance thereof is not increased as much as 2.83% or more.

FIG. 22 is stability analysis results of the cured polymer precursor mixture obtained in a method of transferring a graphene according to an example of the present disclosure. Specifically, the surface was analyzed using an optical microscope. It may be checked through this that, although it is impregnated with various solvents for 60 minutes, a heat cured PEI-GA is not dissolved, and the surface change thereof does not occur.

FIG. 23 is mechanical strength difference analysis results obtained before and after curing the cured polymer precursor mixture obtained in a method of transferring a graphene according to an example of the present disclosure. It may be seen through this that the deformation degree of the polymer precursor mixture deformed when applying the same pressure to a polymer precursor mixture is definitely high before proceeding with the curing reaction. This is due to the solidification caused by the curing reaction, and it may be confirmed through this that the PEI-GA having a curing agent (GA) added thereto is solidified after the heat curing reaction.

Experimental Example 3

Surface resistances of PEI-GA/SiO$_2$/Si obtained while carrying out a method of transferring a graphene according to an example of the present disclosure obtained while carrying out methods of transferring graphenes according to Examples 1 to 3 were compared.

FIG. 24 is a surface resistance graph of PEI-GA/SiO$_2$/Si obtained while carrying out a method of transferring a graphene according to an example of the present disclosure.

Referring to FIG. 24, it may be checked that the lowest resistance result is shown when a ratio of PEI to GA is 100:1, and resistances are relatively high when the ratio of PEI to GA is 10:1 and 1,000:1 since doping is made less as there are few amine groups capable of transporting electrons to the graphene due to an over-heat curing reaction when the ratio of PEI to GA is 10:1, and the graphene is not perfectly transferred as a sufficient heat curing reaction does not occur when the ratio of PEI to GA is 1,000:1.

Experimental Example 4

The transmittance of a UV-visible light wavelength range was analyzed for each of PEI-GA/glass and Gr/glass obtained in Example 5 and Comparative Example 6.

FIG. 25 is transmittance analysis results of the graphenes obtained by methods of transferring graphenes according to an example and a comparative example of the present disclosure. It may be checked through this that the graphene obtained by a method of transferring a graphene according to the example of the present disclosure is very transparent although it comprises GA since the graphene reduces only 0.64% of the transmittance in a 550 nm wavelength range by comprising GA.

Experimental Example 5

Surface resistances of the graphenes obtained in Examples 1 and 4, and Comparative Examples 3 to 5 were compared. Specifically, the surface resistances were analyzed using a 4-point probe measurement method.

FIG. 26 is surface resistance comparison results of the graphenes obtained by methods of transferring graphenes according to examples and comparative examples of the present disclosure.

It may be checked that graphenes (Comparative Examples 3, 4, and 5) transferred through a general wet-type transfer method have a high resistance of several k ohm/□, whereas graphenes (Examples 1 and 4) transferred by a transfer method according to the present disclosure have a very low resistance of 257 ohm/□ to 262 ohm/□. It may be seen through this that surface resistances are lowered as electron concentrations of the graphenes are increased by receiving electrons from amine contained in PEI bonded to the graphenes.

Experimental Example 6

The surface analysis process was performed on each of Gr/PEI-GA/SiO$_2$/Si and Gr/PEI-GA/PEN, i.e., graphenes obtained in Example 6 and Example 7, using an atomic force microscope (AFM).

FIG. 27 is atomic force microscope analysis results of the graphene obtained by a method of transferring a graphene according to an example of the present disclosure, wherein (a) of FIG. 27 is a photograph and graphs showing that the graphene is formed on a copper substrate the surface of which is not treated, and (b) of FIG. 27 and (c) of FIG. 27 are photographs and graphs showing that the graphene formed in (a) of FIG. 27 is transferred.

Referring to this, it may be checked that a terrace exists in the graphene synthesized on copper, and the same terrace exists also in the transferred graphenes of Examples 6 and 7 as a result.

It may be confirmed that, although the transferred graphenes has a tendency similar to the roughness of the terrace face of the graphene surface before the transfer process, the graphenes have improved roughness values compared to a graphene (Gr/Cu) before the transfer process as PEI-GA is used in Examples 6 and 7.

It may be seen through this that a graphene synthesized on an uneven surface may also be transferred as PEI-GA in a liquid state before the heat curing process can form a film along the surface of a graphene with irregularities.

The foregoing description of the present disclosure is for illustration purposes, and it will be understood that one of ordinary skill in the art to which the present disclosure pertains can easily modify technical ideas or essential features of the present disclosure into other specific forms without changing them. Therefore, the examples described above should be understood as exemplary and not limited in ail respects. For example, constituent elements described in a single form may be each implemented in a dispersed manner, and similarly, constituent elements described as dispersed may also be implemented in a combined form.

The scope of the present disclosure shall be expressed in accordance with the scope of the patent claims described later rather than the foregoing detailed description, and all changed or modified forms derived from the meaning and scope of the patent claim scope and equivalent concepts thereof should be construed as falling within the scope of the present disclosure.

EXPLANATION OF MARKS

10: A first substrate on which a graphene is formed
20: A second substrate on which a polymer precursor mixture is formed
30: A structure in which the first substrate on which the graphene is formed is disposed on the second substrate on which the polymer precursor mixture is formed
40: A separated first substrate
50: A separated second substrate
100: A first substrate
200: A metal catalyst
300: A graphene
400: A second substrate
500: A polymer precursor mixture
500(a): A cured polymer precursor mixture 500(b): A cured polymer precursor mixture which does not contain a crosslinking agent

What is claimed is:

1. A method of transferring graphene, the method comprising the steps of:
    forming a graphene on a first substrate;
    forming a polymer precursor mixture on a second substrate;
    disposing the graphene oppositely to the second substrate having the polymer precursor mixture formed thereon;
    pressing the first substrate and the second substrate while curing the polymer precursor mixture; and
    peeling off the first substrate,
    wherein the polymer precursor mixture contains:
    a dopant material comprising an amine group-containing polymer or a precursor thereof; and
    a curing agent selected from the group consisting of glutaraldehyde, propylene dialdehyde, butyl dialdehyde, succinaldehyade, pentane-2,4-dione, acetylacetone, acetonylacetone, and combinations thereof.

2. The method according to claim 1, wherein the dopant material is cross-linked by the curing agent so that a network-structured polymer is formed.

3. The method according to claim 1, wherein the polymer precursor mixture comprises the dopant material and the curing agent at a ratio of 10:1 to 1,000:1.

4. The method according to claim 1, wherein the curing process is carried out under a temperature of 100° C. to 200° C.

5. The method according to claim 1, wherein the step of forming the polymer precursor mixture is carried out by a method selected from the group consisting of a spin coating method, a cast method, Langmuir-Blodgett method, an inkjet printing method, a nozzle printing method, a slot die coating method, a doctor blade coating method, a screen printing method, a dip coating method, a gravure printing method, a reverse offset printing method, a physical transfer method, a spray coating method, a chemical vapor deposition method, a thermal deposition method, a vacuum deposition method, and combinations thereof.

6. The method according to claim 1, wherein the step of forming a graphene on the first substrate is carried out by forming a metal catalyst on the first substrate, and performing a heat treatment process while injecting a gas-phase carbon supply source.

7. The method according to claim 6, wherein the first substrate includes a substrate selected from the group consisting of glass, plastics, silicon, sapphire, nitride, and combinations thereof.

8. The method according to claim 6, wherein the catalyst is selected from the group consisting of Cu, Ni, Sc, Ti, V, Cr, Mn, Fe, Co, Zn, Al, Ti, Si, Mg, Y, Zr, Nb, Mo, Tc, Ru, Rh, Pd, Ag, Cd, Hf, Ta, W, Re, Os, Ir, Pt, Au, Hg, Rf, and combinations thereof.

9. The method according to claim 6, wherein the gas-phase carbon supply source includes a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof.

10. The method according to claim 1, wherein the second substrate is selected from the group consisting of polyethylene naphthalate, silicone, polyimide, polycarbonate, polynorbornene, polyacrylate, polyvinyl alcohol, polyethylene terephthalate, polyethersulfone, polystyrene, polypropylene, polyethylene, polyvinyl chloride, polyamide, polybutylene terephthalate, polymethacrylate, polydimethylsiloxane, and combinations thereof.

11. The method according to claim 1, wherein the graphene is n-type doped while the polymer precursor mixture is being cured.

12. A flexible transparent electrode comprising a graphene transferred by a method of transferring a graphene according to claim 1.

13. The method according to claim 1, wherein pressing the first substrate and the second substrate while curing the polymer precursor mixture further comprises:
    pressing the first substrate and the second substrate together with strong binding force by applying mechanical force to top and bottom surfaces.

14. The method according to claim 1, wherein peeling off the first substrate further comprises:
    delaminating the graphene by applying a mechanical force and peeling off the first substrate.

* * * * *